(12) United States Patent
Purushothaman et al.

(10) Patent No.: US 7,855,455 B2
(45) Date of Patent: Dec. 21, 2010

(54) LOCK AND KEY THROUGH-VIA METHOD FOR WAFER LEVEL 3 D INTEGRATION AND STRUCTURES PRODUCED

(75) Inventors: Sampath Purushothaman, Yorktown Heights, NY (US); Mary E. Rothwell, Ridgefield, CT (US); Ghavam Ghavami Shahidi, Pound Ridge, NY (US); Roy Rongqing Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/239,688

(22) Filed: Sep. 26, 2008

(65) Prior Publication Data

US 2010/0078770 A1     Apr. 1, 2010

(51) Int. Cl.
 *H01L 23/48* (2006.01)
(52) U.S. Cl. ............... 257/750; 257/758; 257/760; 257/E23.01; 257/E23.011
(58) Field of Classification Search ................. 257/750, 257/758, 760, 762, 764, 773, 774, 784, E23.01, 257/E23.011, E23.012; 438/106, 107, 118
See application file for complete search history.

(56) References Cited

U.S. PATENT DOCUMENTS

| | | | |
|---|---|---|---|
| 6,090,633 A | 7/2000 | Yu et al. ....................... 438/15 |
| 6,281,452 B1 | 8/2001 | Prasad et al. ................. 174/282 |
| 6,444,560 B1 | 9/2002 | Pogge et al. ................. 438/612 |
| 6,599,778 B2 | 7/2003 | Pogge et al. ................. 438/118 |
| 6,640,021 B2 | 10/2003 | Pogge et al. ................... 385/14 |
| 6,678,949 B2 | 1/2004 | Prasad et al. ................... 29/840 |
| 6,737,297 B2 | 5/2004 | Pogge et al. ................. 438/107 |
| 6,835,589 B2 | 12/2004 | Pogge et al. ................... 438/52 |
| 6,856,025 B2 | 2/2005 | Pogge et al. ................. 257/774 |
| 6,864,165 B1 | 3/2005 | Pogge et al. ................. 438/812 |
| 6,998,327 B2 | 2/2006 | Danielson et al. ........... 438/455 |
| 7,049,697 B2 | 5/2006 | Pogge et al. ................. 257/723 |
| 7,071,031 B2 | 7/2006 | Pogge et al. ................. 438/109 |
| 7,203,387 B2 * | 4/2007 | Doan ........................... 385/14 |
| 7,344,959 B1 | 3/2008 | Pogge et al. ................. 438/459 |
| 7,354,798 B2 * | 4/2008 | Pogge et al. ................. 438/109 |
| 2006/0292744 A1 * | 12/2006 | Enquist et al. ............... 438/107 |

* cited by examiner

*Primary Examiner*—Zandra Smith
*Assistant Examiner*—Paul E Patton
(74) *Attorney, Agent, or Firm*—Robert J. Eichelburg; The Law Offices of Robert J. Eichelburg

(57) ABSTRACT

A three dimensional device stack structure comprises two or more active device and interconnect layers further connected together using through substrate vias. Methods of forming the three dimensional device stack structure comprise alignment, bonding by lamination, thinning and post thinning processing. The via features enable the retention of alignment through the lamination process and any subsequent process steps thus achieving a mechanically more robust stack structure compared to the prior art.

7 Claims, 39 Drawing Sheets

Figure 1 (Prior Art, drawing not to scale)

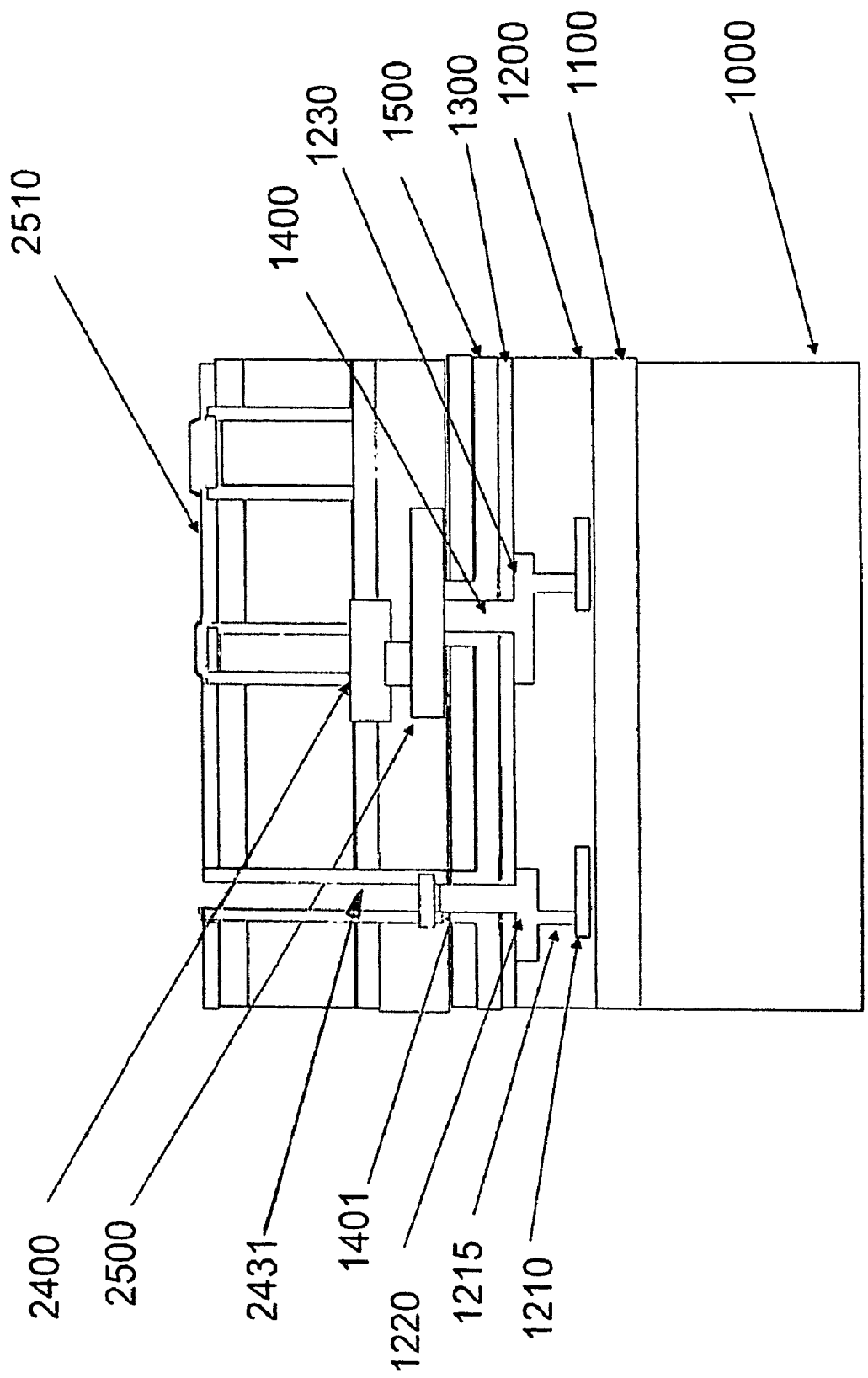

LOCK AND KEY THROUGH-VIA METHOD FOR WAFER LEVEL 3 D INTEGRATION AND STRUCTURES PRODUCED

DESCRIPTION OF THE INVENTION

1. Field of the Invention

The field of the invention comprises three dimensional integration of circuit components into functionally enhanced structures using a wafer-level layer transfer process based on a lock and key process enabled with wafers comprising through silicon vias.

2. Background of the Invention and Related Art

Scaling of CMOS transistor devices to smaller and smaller dimensions to enable larger circuit density is running into challenges wherein the performance of such ultra small devices is not scaling favorably due to short channel effect in the device behavior, the difficulty in scaling channel strain induced mobility enhancements and the like. Additionally, with increased logic circuit density, the demand for memory accessible by logic circuits with minimal delay and memory bandwidth to access a large segment of the memory at a given time, are becoming paramount to achieving peak performance. This in turn drives two requirements. First, additional memory needs to be embedded along with the logic circuitry on the same chip thus competing for the silicon real estate on the chip. Second, fast access and high bandwidth interconnects are required for the logic circuits to send and retrieve information from these memory cells on the chip thus driving a huge increase in interconnect density and speed.

This in turn drives the interconnect needs for future microprocessors and other high performance chips, requiring a continued push to lower effective dielectric constant (referred to hereinafter as $k_{\mathit{eff}}$) of inter-level dielectric materials, higher aspect ratio (wire height over wire width) for all wiring levels, and increasing number of metallization layers. At this point the back-end-of-the-line (BEOL) interconnects may consist of as many as ten metallization levels that contain wires to provide interconnections for signal, clock, power, repeaters, devices, decoupling elements, and the like. As future interconnects shrink in dimension to allow gigascale device integration, the signal delay and the signal fidelity problems associated with the interconnects become significant limiters of the overall system performance. Therefore, it has been realized that there will be a slow down in the rate of performance improvements for new generations relative to the famous Moore's law of microprocessors if one were to depend on the current state of the art planar chip architectures alone. New solutions therefore become a necessity if significant improvements are to be achieved in future IC generations.

To overcome the limitations of the fully planar integration schemes a variety of three-dimensional (3D) integration and packaging techniques are being evaluated in the art. The main considerations behind the use of 3D Integration are: minimization of the interconnect wire length and especially the long interconnects due to the ability to connect vertically between a 3D stack of device layers and the implementation of related design flexibility including new system architectures afforded by stacked device layers. For example, it is possible to stack a memory device layer on a logic device layer and enable a larger amount of memory connected to the logic at a high band width by means of vertical via interconnects.

For 3DI device integration a composite interface joining such as Transfer & Joining (T&J) has demonstrated good success in practice. In this T&J method the metal studs on the bottom surface of the top wafer are mated with a recessed metal pad at the bottom of blind vias located at the top surface of the bottom wafer. The top surface of the bottom wafer is provided with an adhesive to facilitate the dielectric bonding while the metal studs and recessed pads in the blind vias bond to form metal connection. Both connections are formed in a single lamination step. This stud in via arrangement allows an accurate positioning of the two wafers, eliminates slippage and distortion between the two wafers during lamination, and is accommodating to surface topography, among other advantages. The via/stud lock and key combination can be built in reverse order with the studs on the bottom wafer and recessed vias in the top wafer if such a process is called for.

The other joining methods, such as oxide to oxide and Cu to Cu thermo-compression, are constrained by limited flow of the bonded materials and thus require stringent tolerance on the mating surfaces. Further the initial alignment between the mating features has to be maintained through additional mechanical attributes such as special fixtures or tooling. However in the T&J approach, the lock and key aspect of the stud and recessed pad under a via helps partially to assure retention of the initial good alignment.

While forming a metal and dielectric connection in one lamination step has advantages for the T&J connection method, T&J addresses only interface bonding (studs into blind vias) and does not address the issue of through-via connection required for layer to layer connection in a 3D device stack. For this purpose, through-silicon-vias are required and are formed in a different step to enable contacts to be brought to the top surface of the upper device wafer, or bottom of the lower device wafer for controlled collapse chip connections (C4) to the outside world or to a third device layer.

Currently practiced through-via methods in the art include deep silicon etch with W fill (typically about 10 to about 50 um wide and up to about 150 um deep) or moderate depth silicon vias with Cu fill (about 1 to about 5 um wide and about 20 um deep). Both through-via methods are quite elaborate in process and limited in pitch achievable and hence not easily extendible to finer feature high density device-device connection.

At this point, 3D wafer-scale integration is a relatively new technology and further investigations including methodologies for reliable etching, cleaning, filling, aligning, bonding integrity, wafer-scale planarity, and integration with active circuits and the like have to be fully demonstrated. 3D integration based on stacking of wafer-level device layers has been a main focus of 3D IC technology. This process includes fabrication of each component on a separate wafer with its optimized processing technology, followed by aligning, bonding, and vertical interconnection of the wafers to build a new high functionality system.

Some of the key challenges in this regard include: formation and filling of deep vias (about 50 to about 150 micron deep, about 2 to about 50 micron in diameter typically) in silicon and reliably filling the same with metal; the ability to reliably align multiple device layers to each other in a precise fashion, and join to enable vertical electrical connections in adequate numbers at fine pitch; and lastly, achieving good mechanical bonding between the bonded layers and the like. Tooling is available to make deep vias in silicon but reliably filling such vias with metals is a challenge. Available alignment tools can at best achieve about 1 to about 2 micron alignment accuracy which tends to limit the size and pitches of the bonding features which in turn can limit the vertical interconnect density and count. Oxide-oxide bonds and metal-metal bonds typically used do not provide adequate mechanical bond strength between layers especially if the allowed bonding temperatures are restricted to about 400 C to be compatible with pre-existing on chip interconnects in the device layers being bonded.

3. Related Art

Transfer joining methods employing polymeric adhesives have been developed employing metal studs in one device layer plugged into blind vias in dielectric and bonded to underlying pads on a second device layer. These methods have been used to alleviate the alignment and bond strength aspects alluded to earlier, see for example, Pogge et al., U.S. Pat. Nos. 7,354,798; 7,071,031; 7,049,697; 6,998,327; 6,864,165 6,856,025; 6,835,589; 6,737,297; 6,640,021; 6,599,778; 6,444,560; Yu, et al. U.S. Pat. No. 6,090,633; and Prasad et al., U.S. Pat. Nos. 6,678,949; and 6,281,452. The challenges associated with deep silicon etch and fill required for through vias, however, are not addressed by these transfer joining enhancements.

It is desirable, therefore, to form face to face connections and through wafer via connections at the same time and with very high density and yield. Additionally, if all or a subset of the layer to layer connections are made by this new method the number of metal to metal connections made by bonding can be significantly reduced which can be potentially conducive to higher final yield. Enablement of higher density through vias can also allow the use of some of these vias for repair/rerouting if some of the face to face bonded contacts do not yield and can be identified and rerouted using through vias instead. This disclosure describes methodologies to enable the formation of through vias and contacts for face to face bonding without the need for deep silicon through via processing. Several unique structures that result from these methods are also described.

A key issue associated with 3D device stack currently known in the prior art is the fabrication of the deep TSV's which are usually formed in the starting substrate before it is thinned down. For wafer scale 3D integration application, typically these TSV's are preferably about 1 to about 5 microns in diameter and about 20 to about 100 microns deep. The smaller diameter is required to enable a reasonably large number and closely spaced vertical connections between the device layers. The high aspect ratio range of these TSV's makes it very challenging to both form the via openings by reactive ion etching (RIE) and to subsequently fill them with CVD metal fill processes (CVD tungsten for example) or plating processes (electroplated Cu for example). Incomplete fill or fill with seams or voids is undesirable as this leads to poor electrical contacts and potential for trapping processing chemicals during subsequent steps. Thus it is desirable to enable a lower aspect ratio TSV methodology that will be consistent with the small TSV diameter required for high density vertical interconnects. This enables the use of a smaller foot print to accommodate the TSV interconnects or the use of increased number of vertical interconnects for a given foot print.

Second, the alignment between the two substrates prior to final bonding is currently achieved by using vision systems to align them and mechanical placement, clamping and adhesive tacking to retain them in alignment for subsequent processing. The invention provides a better means to enable self alignment and retention of alignment by building in physical features in the substrates to be bonded.

Third, in the prior art structure, the mechanical integrity after bonding is dependent on metal to metal laminated bonds and adhesive bonds. This would be more challenging when the TSV's are made shorter to make their fabrication more feasible and hence the substrate with the TSV's is required to be thinner. It will be desirable to enhance the mechanical integrity in some way using modifications to the structure.

It is therefore the object of the present invention to enable a 3D device stack employing reduced thickness through silicon vias. It is another object of the present invention to enable better alignment between the bonded substrates in the 3D device stack and maintain the alignment through the various process steps. It is further an object of the present invention to enhance the mechanical integrity of the bonded 3D device structure by making a suitable structural provision. This and other aspects of the invention are described in detail below with reference to the figures listed herein.

SUMMARY OF THE INVENTION

Accordingly, the present invention provides structures, articles of manufacture and processes that address these needs to not only provide advantages over the related art, but also to substantially obviate one or more of the foregoing and other limitations and disadvantages of the related art. Not only do the written description, claims, abstract of the disclosure, and the drawings, that follow set forth various features, objectives and advantages of the invention and how they may be realized and obtained, but these features, objectives and advantages of the invention will also become apparent by practicing the invention.

To achieve these and other advantages, and in accordance with the purpose of the invention as embodied and broadly described herein, the invention comprises improved through wafer electrical interconnection between device layers by employing a much shorter through via which is exposed and filled after joining of the device layers and back side wafer thinning. The present invention also enables self alignment between the device layers being bonded by means of a lock feature in the form of a through via provided in one device layer and key feature provided in another device layer. The specific structural means that function as lock and key elements in the new inventive structures will be identified and described in detail later through the use of illustrative figures.

The present invention also comprises forming a filled through via and upper pad structure in the thinned and bonded substrate that rivets the substrates together and improves the mechanical integrity of the bonded structures. The through vias of this invention comprise an electrically conductive material such as Al, Mo, W, Cu, Au, Ag, Pd, Pt, Ni, or combinations thereof with one another, which includes alloys or mixtures thereof, or alloys or mixtures thereof with equivalent elements, or equivalent materials, compounds or alloys. The current invention also enables high bond strength between device layers by utilizing a suitable adhesive layer that is compatible with the thermal budget of the device layers being bonded together. These objects and the associated embodiments are described in detail below along with illustrative drawings listed herein.

FIG. 1 depicts a typical prior art transfer and joined structure (referred to as T&J hereafter) employing through silicon vias which are deep (about 50 to about 100 microns). Layer to layer electrical connections are achieved by means of bonding between metal studs on one wafer and a landing pad in the other wafer. Mechanical integrity is achieved by means of an adhesive layer disposed between the two layers and filling any gaps between the bonded metal features. This adhesive, as well as the other adhesives employed according to the invention and which we describe herein comprise a polyimide adhesive, or benzocyclobutene adhesive, or polyarylene ether adhesive, or epoxy adhesive and the equivalents thereof, including a combination of adhesives. In particular, the structure comprises a first device substrate 1000 bonded to a second device substrate 2000. The first substrate 1000 is provided with a set of devices contained in layer 1100 and interconnects contained in layer 1200. The first substrate comprises silicon, or gallium arsenide, or silicon carbide.

Details of the devices and interconnects in these layers are not shown for the sake of simplicity. In one embodiment, however, the interconnect layers in the second device layer comprise dual damascene wiring and vias, through substrate vias and combinations thereof.

This first substrate further comprises an upper insulator 1300 through which studs 1400 are provided. Studs 1400 are connected to selected points 1250 on the interconnects present in the interconnect layer 1200. The second device substrate 2000 is thinner than the first substrate 1000 and provided with deep through silicon vias (TSV) 2600 that extend through the entire thickness of the substrate. The second substrate comprises silicon, or gallium arsenide, or silicon carbide.

These TSV's connect to selected locations of the device in device layer 2100 and to selected points 2240 of the interconnects in the interconnect layer 2200 on this thinner device substrate. Substrate 2000 is also provided with an insulation layer 2300 and a set of pads 2400, the pads being connected to selected locations 2250 in the interconnects in the interconnect layer 2200. Studs 1400 and pads 2400 are bonded together to enable electrical connection between the two substrates while an adhesive 1500 provides a mechanically robust bond between the substrates. The top of the bonded structure is also provided with additional interconnects 2700 and I/O (input/output) terminals 2900 as shown. We have previously demonstrated that T&J stud/via structures can be built between about 1 um to about 3 um in thickness for oxide ILD. For polyimide ILD thickness is normally 3-30 um. We also demonstrated that the entire Si bulk can be removed from the bonded wafers by a judicious combination of wafer grinding, polishing and RIE processes after the Si wafer is securely bonded to a carrier wafer or a bottom device wafer.

Since most of the active circuitry and wiring in a typical top device wafer with BEOL is about 5 um thick, we propose to use this stack itself as the T&J interface by incorporating through vias in this reduced thickness stack. In such a top wafer, these through via locations will not have metal landing pads as in the case of standard T&J-contacts (used for blind via stud to pad connection) but will be etched as deep as possible by reactive ion etching (RIE) to pass through the back end of the line (BEOL) and front end of the line (FEOL) layers at previously assigned locations and come into the Si bulk surface. This can be enabled with the use of a suitable block out mask and etch scheme after the top wafer has completed device and BEOL steps.

An art-known adhesive or equivalent is applied on the bottom wafer and studs are fabricated on that wafers as in the standard T&J approach. Some of the studs will mate and bond to pads in blind vias in the top wafer. Other studs will be inserted into the recess locations reserved for through vias in the top wafer as described above. The two wafers are aligned with the studs in the bottom wafer aligned and contained in the via pockets in the upper wafer and laminated together using the adhesive bonding. Metal to metal bonding is accomplished in the blind vias reserved for the face to face connections. However, no electrical connections are made at the through via locations at this point. After the lamination, the studs at these locations pass through and their tips are located slightly below surface of the upper silicon wafer.

The bulk Si of the top wafer is then removed by grinding and etching to expose the studs by opening up the through vias. At this juncture the studs will appear as if they are through pins coming through these vias in the upper device further connect stack layer. Appropriate wet or dry cleans can be performed to expose the studs metal for ensuring good metal contact. A metallization step is then applied to the upper surface of the bonded and thinned structure to make contact with the studs in the through-vias. An exemplary combination of sputter deposited liner/seed, plating and CMP can be employed or a CVD liner and W fill can also be used. The metal fill in the through via locations leads to the "riveting" of the two wafers together mechanically and enables electrical connection to the studs from the bottom wafer.

After two wafers are "riveted" together in this manner, the top wafer can then either be finished with C4 processing to provide the necessary I/O options or the through via studs can be used to receive a second top wafer by repeating the above innovative process sequence. This process can be repeated as many times as needed for the required stacks of device layers. The top most layer in the stack is finally used to provide the I/O connections from the stack.

In this manner, all the through via stud rivet connections are made using conventional additive metal processes used commonly in MOL, BEOL or packaging schemes and not by a combination of deep silicon etch/fill and metal to metal bonding processes. As the size of the through vias is not as limited by aspect ratio concerns as in the conventional deep Si through vias, smaller vias and greater via density can be achieved allowing the stacking of many device layer if desired.

Thus, a fundamentally important feature of the present approach is that the through via electrical continuity between the bottom and top wafer(s) is not dependent on deep Si etch and fill yields or metal to metal bonding yields as in the case of the conventional 3DI or 3DI T&J approaches. Since in the current approach, the connection between the studs in the bottom wafer and the "rivet head" which is part of the upper wafer is achieved by the traditional metallization processes (after optionally cleaning the metal stud exposed in the through vias), this connection can be made as high yielding and robust as a standard via connection in a BEOL build with relaxed via dimensions. This is likely to be significantly better than what one might expect for the combined deep Si etch and fill plus metal to metal bonding yields practiced in the prior art 3D integration approaches.

Another important benefit that can be derived from this through via approach is the option to print and etch standard alignment marks at the same time as when the through via recess is etched into the upper silicon wafer. These marks will be exposed after lamination and upper wafer thinning and appear as trench marks when viewed from the top. As such these can be used for lithographic alignment of any added patterns or additional bonding layers added on top. In the conventional 3DI approach, transfer marks required for this alignment need to be made by deep silicon etching. Limitation in aspect ratios and RIE lag issues dictate that these marks necessarily be coarse. Their fidelity can also be less than optimal due to the deep silicon etch needed to etch them through a large depth of silicon. In contrast, as the etch depth involved in the present inventive approach is much less and can easily accommodate the standard fine size stepper alignment marks. This improves the ease and accuracy of alignment of post-lamination added patterns and layers to the second wafer.

Other embodiments include the use of a passivation layer based on passivation materials such as those comprising silicon nitride applied to the walls of the through via recesses (by a deposition and etch method analogous to a sidewall spacer process) to insulate the inserted stud and the added metal fill after joining from the devices in the upper layer SiN passivation can also be deposited on the studs and the surface of the bottom wafer before applying the adhesive layer in order to hermetically seal the copper during the preparation, alignment and bonding steps. This SiN coating can be etched off by RIE or similar process at the specific contact locations desired just before the added metal fill process is performed. Such a structure provides a further insurance against any adverse interaction of the through via metal or added metal fill with the device layers in the upper wafer and provides passivation of metal features from an environmental ingress and reliability perspective. Additionally, selective metal passivation using electroless Sn, Au or Co—W—P coatings can be performed to the studs if desired to improve their corrosion resistance.

BRIEF DESCRIPTION OF THE DRAWINGS

The accompanying Figures incorporated into the specification, together with the detailed description herein, serve to further illustrate various embodiments and to explain various principles and advantages of the present invention.

DETAILED DESCRIPTION

Figure 1:
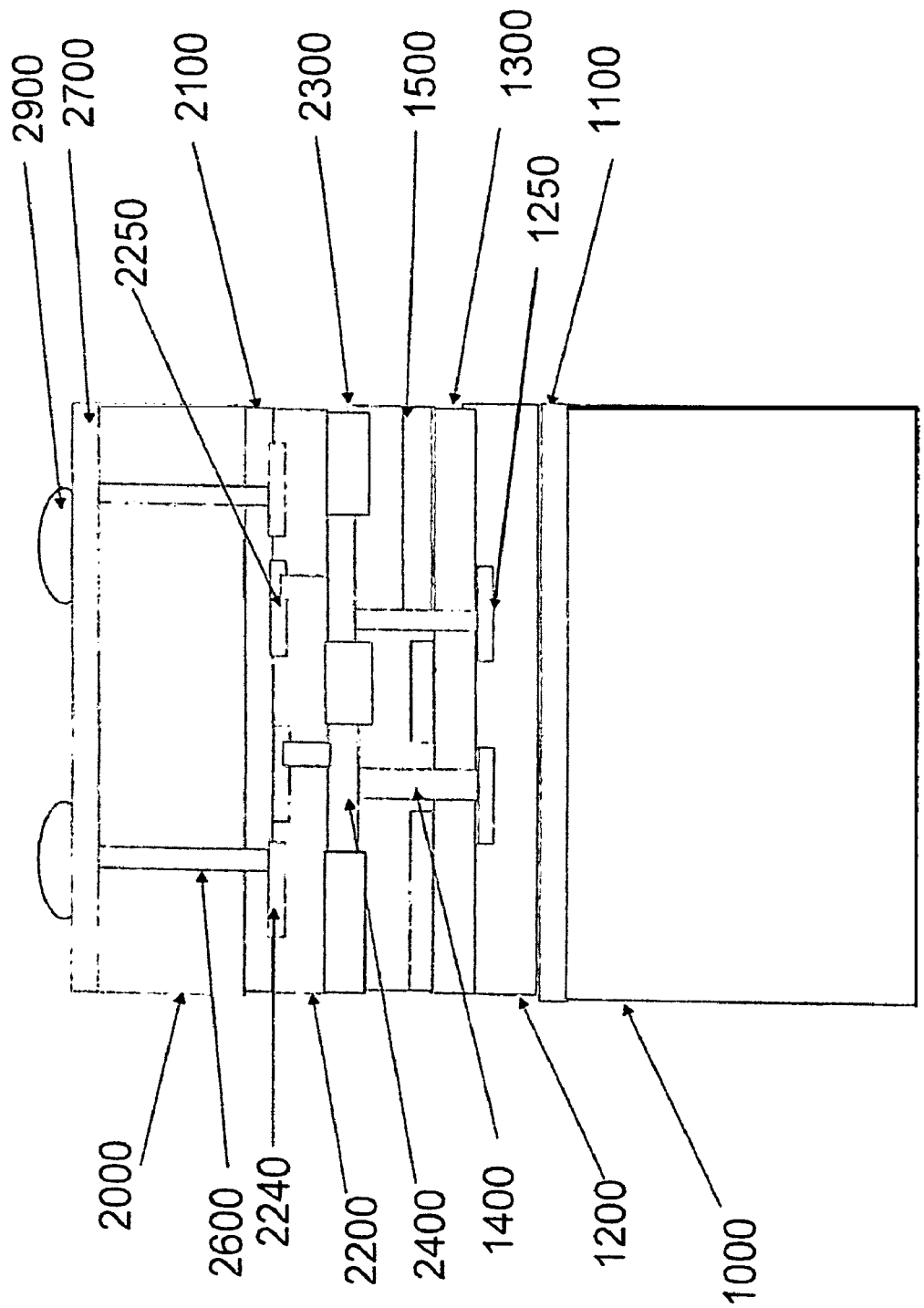
FIG. 1 comprises a side elevation in cross-section showing a 3D device stack structure formed using the prior art transfer joining process and deep through silicon vias.

To achieve these and other advantages, and in accordance with the purpose of this invention as embodied and broadly described herein, the following detailed embodiments comprise disclosed examples that can be embodied in various forms. The specific processes and structural details set out herein comprise a basis for the claims and a basis for teaching one skilled in the art to employ the present invention in any novel and useful way. The terms, phrases and Figures also set out herein provide a description of how to make and use this invention. One having ordinary skill in the relevant art, once aware of the present disclosure, could employ suitable processes and structures without undue experimentation.

In one aspect, the invention comprises a structure comprising two device layers joined together to form an electronic system which comprises:

a first device layer disposed on a first substrate and comprising a first set of circuits and interconnect wiring;

a second device layer disposed on a second substrate and comprising a second set of circuits and interconnect wiring;

the first and the second device layers further connected using two sets of via connections comprising a first set of via connections that extend from the top surface of the first device layer to the top surface of the second device layer and a second set of via connections that extend from the top surface of the first device layer through the second device layer, the second substrate and connecting to interconnect layers and input output terminals disposed on the back side of the second substrate.

In another aspect, the invention comprises a method of fabricating a stacked device structure comprising the steps of:

a. fabricating on a first substrate a first device layer comprising a first set of circuits and first set of interconnects;

b. etching a first set of deep openings for vias and alignment marks that extend through the device layer and interconnects, to a certain depth into the first substrate;

c. providing a first insulating lining to protect the side walls of the first set of openings for via and alignment marks and filling and planarizing the first set of openings with a first conductive material;

d. disposing contact vias and bonding pads connected to the filled vias;

e. further disposing an insulator layer and an adhesive layer over the top and providing openings in the insulator and the adhesive layers at the bonding pads and etching a second set of deep via openings that extend all the way into some depth of the first substrate;

f. fabricating on a second substrate a second device layer comprising a second set of circuits and second set of interconnects;

g. forming a damascene interconnect level comprising conductive studs embedded in a dielectric and connecting to selected locations on the second interconnects and recessing the dielectric to expose a portion of the height of the conductive studs;

h. aligning the first substrate on top of the second substrate face to face such that a first subset of the conductive studs on the second substrate are aligned to the bonding pads on the first substrate and a second subset of the conductive studs on the second substrate are inserted into the second set of deep via openings in the first substrate;

i. laminating the first substrate and the second substrate to bond them together using the adhesive layer, the adhesive flowing and filling any gaps between the substrates and around the conductive studs forming a bonded structure;

j. removing the bulk of the thickness of the first substrate from the top of the bonded structure by a combination of grinding, polishing and etching to expose the bottom of the filled vias and the filled alignment marks and to open up the bottom of the second set of deep via openings;

k. disposing a second insulating lining to protect the side walls of the second set of deep via openings and filling and planarizing the via openings with a second conductive material;

l. constructing additional interconnect and input output terminals on the top of the thinned bonded structure using the filled alignment marks for reference, thus completing a three dimensional device stack structure.

Figure 2:
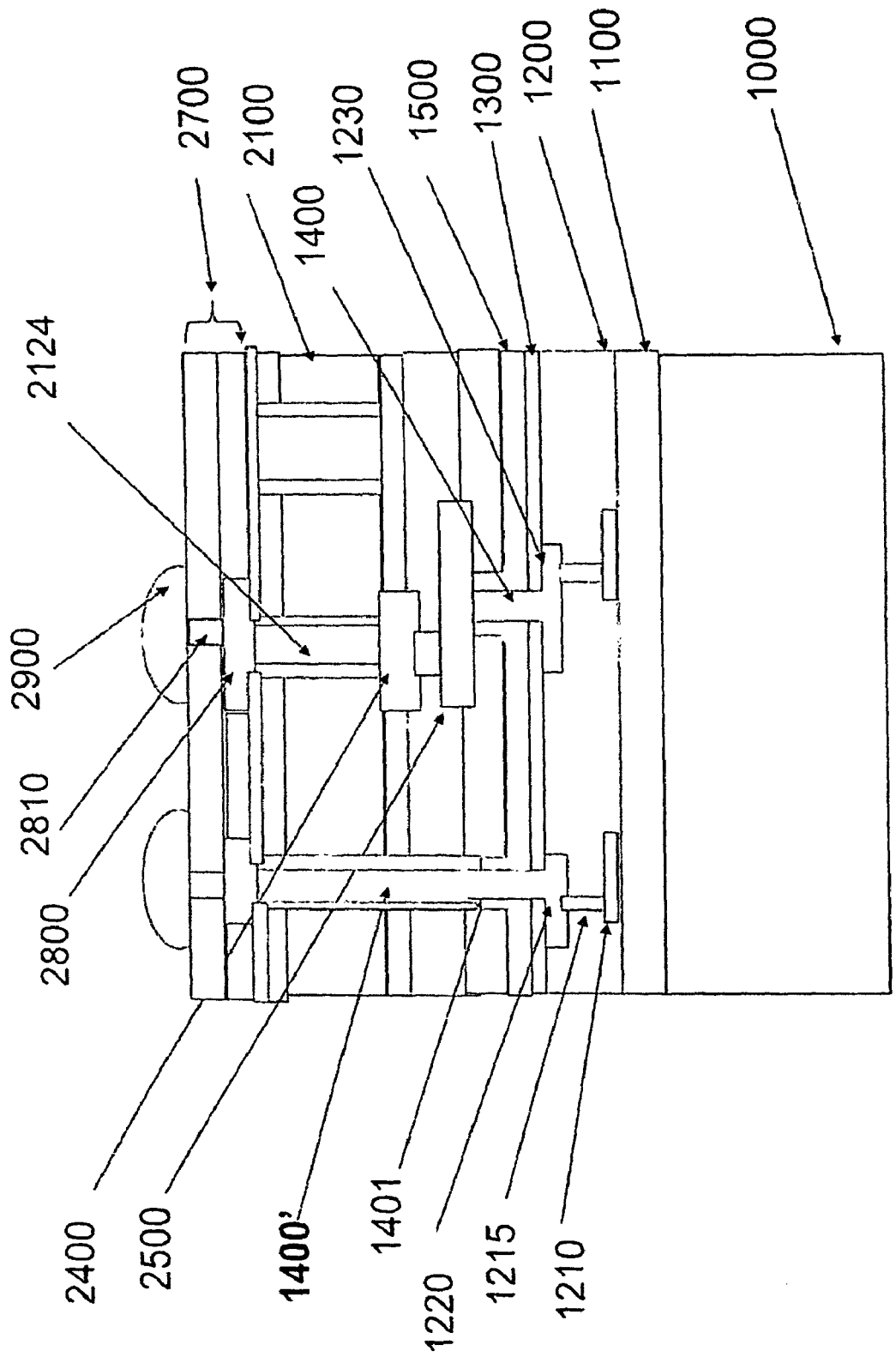
FIG. 2 comprises a side elevation in cross-section showing an inventive 3D device stack structure according to one embodiment of the present invention.

The term "device" used above and throughout this specification comprises an integrated circuit, i.e., an "I/C" or one or any combination of components that make up an I/C as that term is known and used in the related art. Referring to FIG. 2 an inventive structure comprises a first device wafer 1000 with a device layer 1100 and an interconnect layer 1200. This device wafer is bonded to a much thinner second device substrate 2000 provided with device layer 2100 and interconnect layer 2200. The wafer to wafer connection is accomplished through two types of connections. The first set comprises bonds between studs 1400 provided in the first wafer and pads 2400 provided in the second wafer and is similar to the transfer join bonds in the prior art. As in the prior art, the joining interface between the two wafers is also provided with an adhesive 1500 to strengthen the bond. In addition, the inventive structure comprises a second set of studs 1400' which extend from the interconnect layer 1200 of the first device wafer through the interconnect layer 2200 and device layer 2100 and the body of the second device wafer 2000 and connecting to metallization pad 2260 located at the bottom of the top interconnect layer 2700.

These through studs act to provide a lock and key type alignment of the two wafers during the alignment process as described in detail later. Further, these studs 1400' in conjunction with pad 2260 act as rivet like reinforcements and resist shear type lateral displacements in the structure making it mechanically more robust. As a result of this reinforcement, the second device wafer substrate 2000 can be made substantially thinner and the TSV's 2124 in that wafer can be made substantially shorter than the comparable TSV's 2600 shown in the prior art structure of FIG. 1. Thus all the difficulties associated with etching and filling deep vias in the wafer 2000 and issues associated with misalignment and later displacement of device layers relative to each other are obviated.

In another embodiment, we provide an inventive structure wherein the metal studs are passivated using a suitable metal or insulator layer that surrounds the exposed sidewalls of the studs wherein they are in surrounded by the adhesive material used for layer to layer joining. As illustrated in the cross sectional illustration in FIG. 3, the passivation coating 1450 surrounds both types of studs 1400 and 1400' in the region where they are enclosed by the adhesive 1500. This passivation coating protects the metal studs from potentially deleterious interaction with environmental species such as oxygen, moisture and the like which might diffuse into the structure through the adhesive layer. Such species can otherwise oxidize or corrode the metal studs causing poor electrical reliability of the connections.

The following description pertaining to both insulating or conductive passivation layers set out two embodiments of the passivation layer comprising the invention. Thus the passivation coating, can be an insulating passivation coating which comprises one of silicon nitride, silicon oxide, silicon carbide, silicon carbontride and combinations thereof with one another or equivalent elements or compounds or compositions. Alternately, the passivation coating can also be a conductive passivation coating such as materials comprising gold, nickel, cobalt, Co—W—P and combinations thereof or equivalent elements or compounds or compositions and is applied to coat and protect the metal studs.

Figure 4:
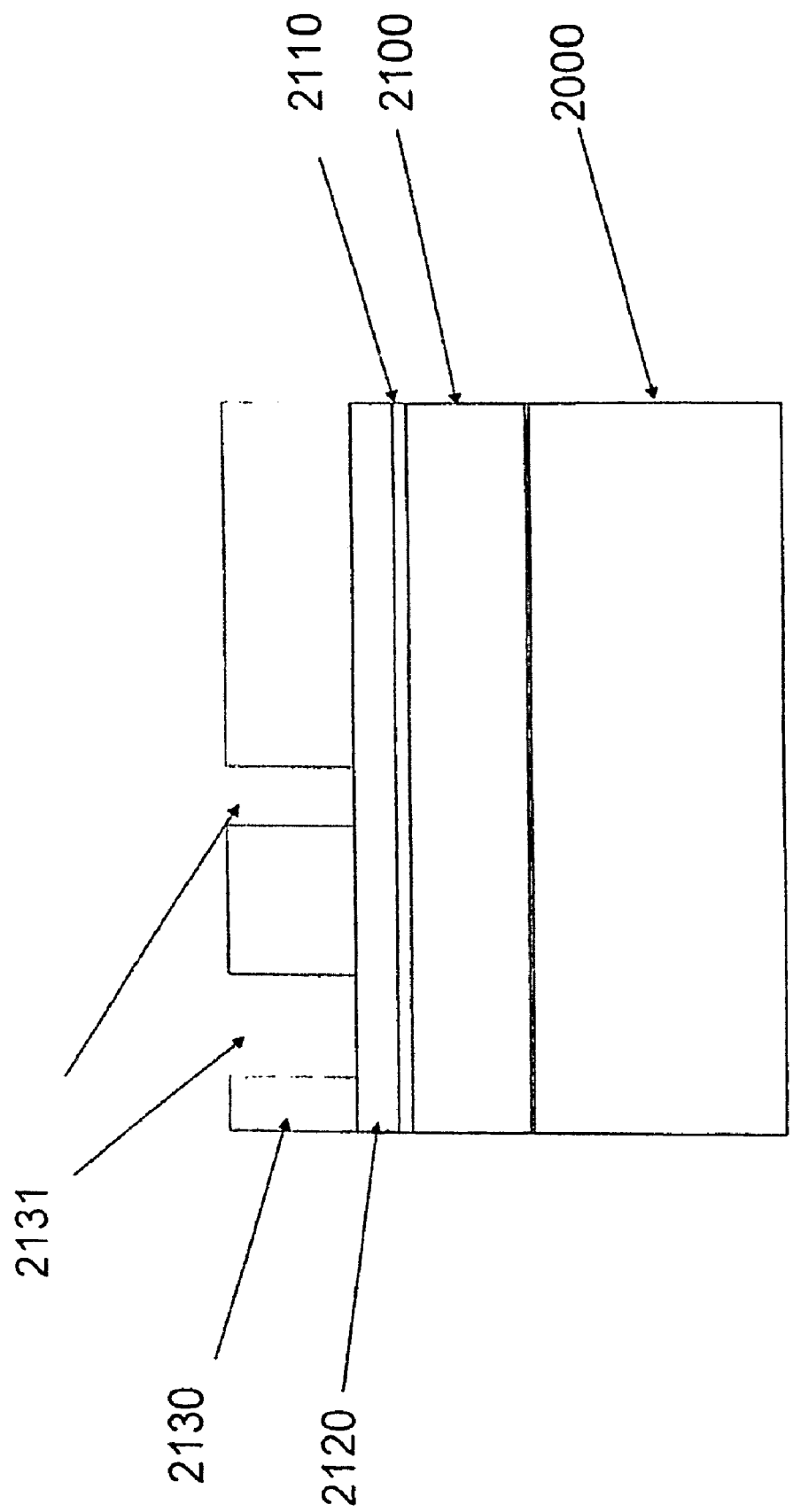
FIGS. 4(A) through 4(Q) comprise side elevations in cross-section illustrating a schematic process flow for fabricating the inventive device stack structure which comprises an embodiment of the present invention.
Figure 4:
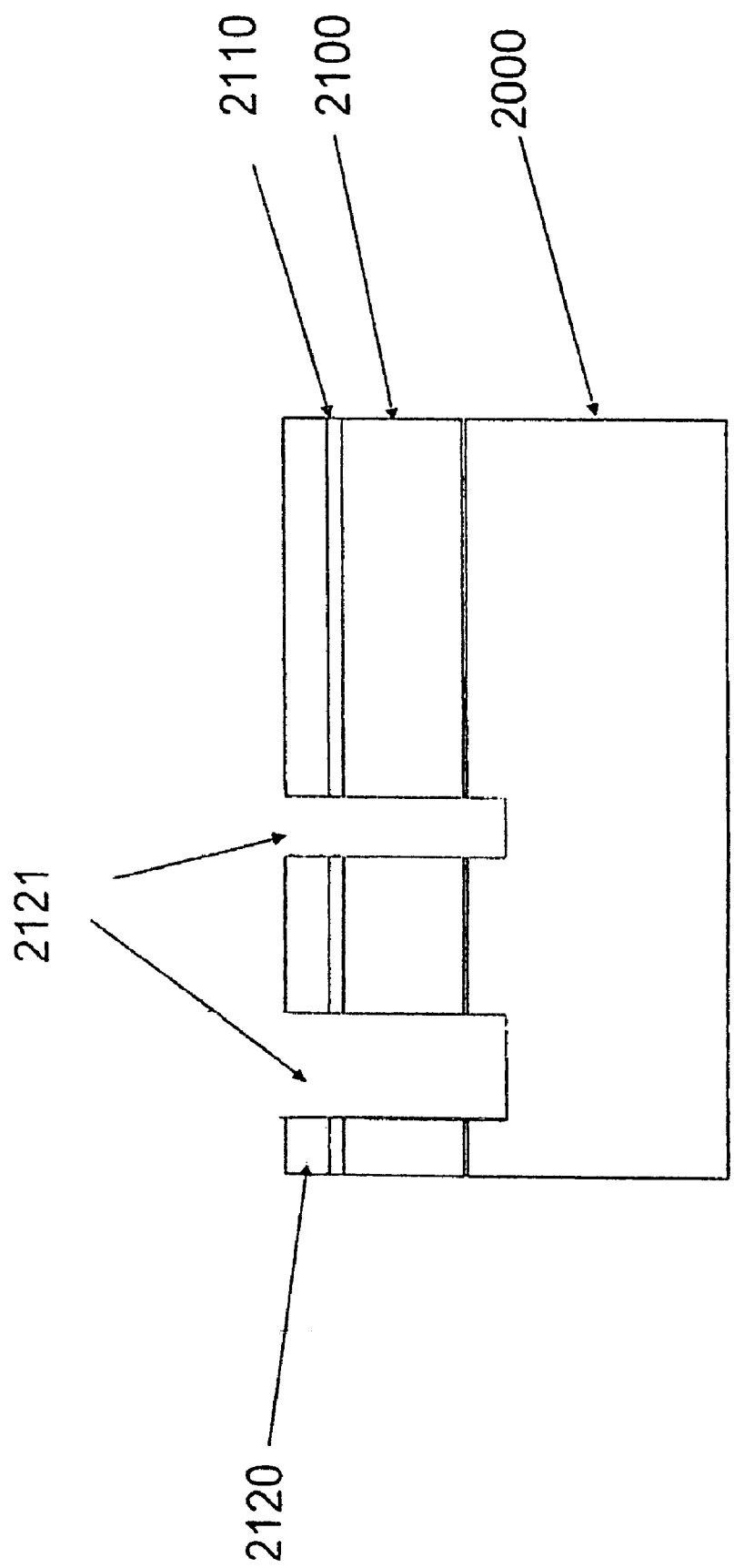
Figure 4:
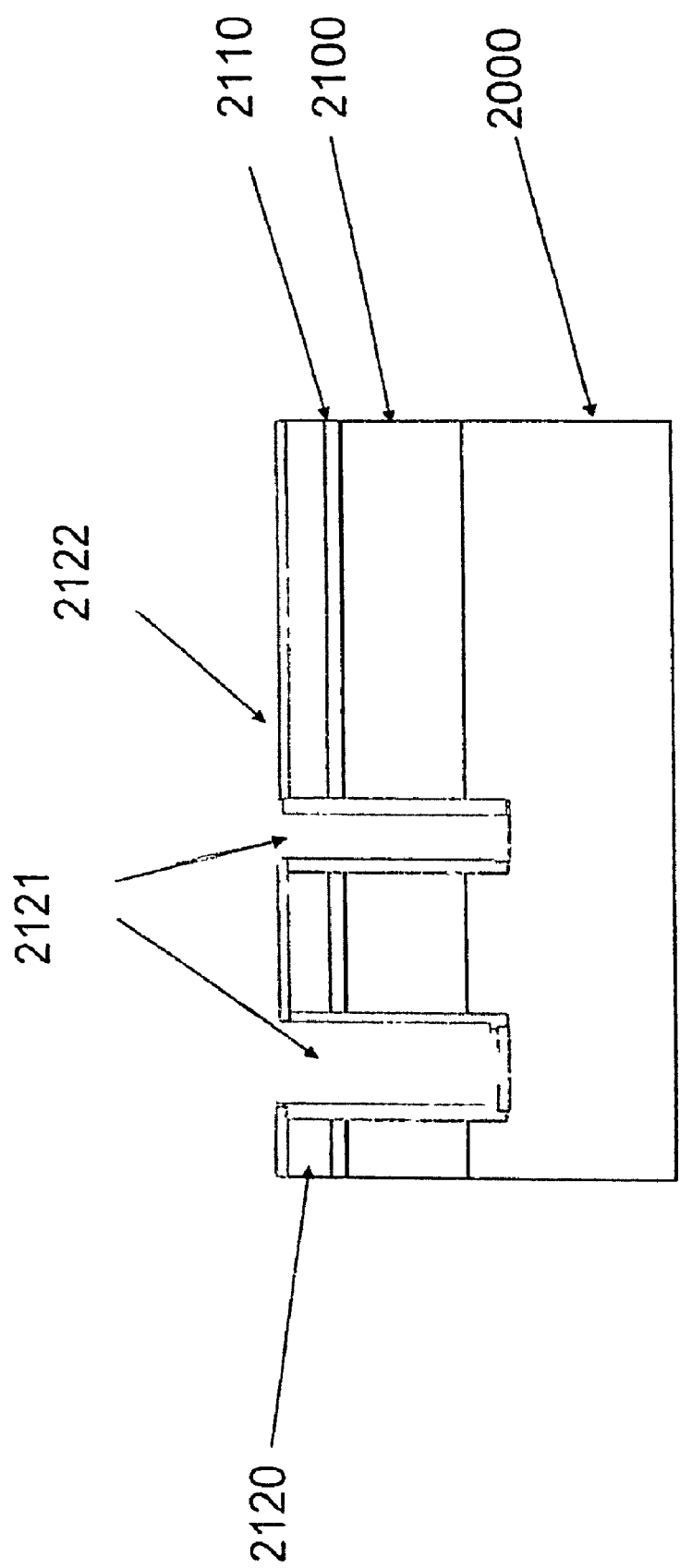
Figure 4:
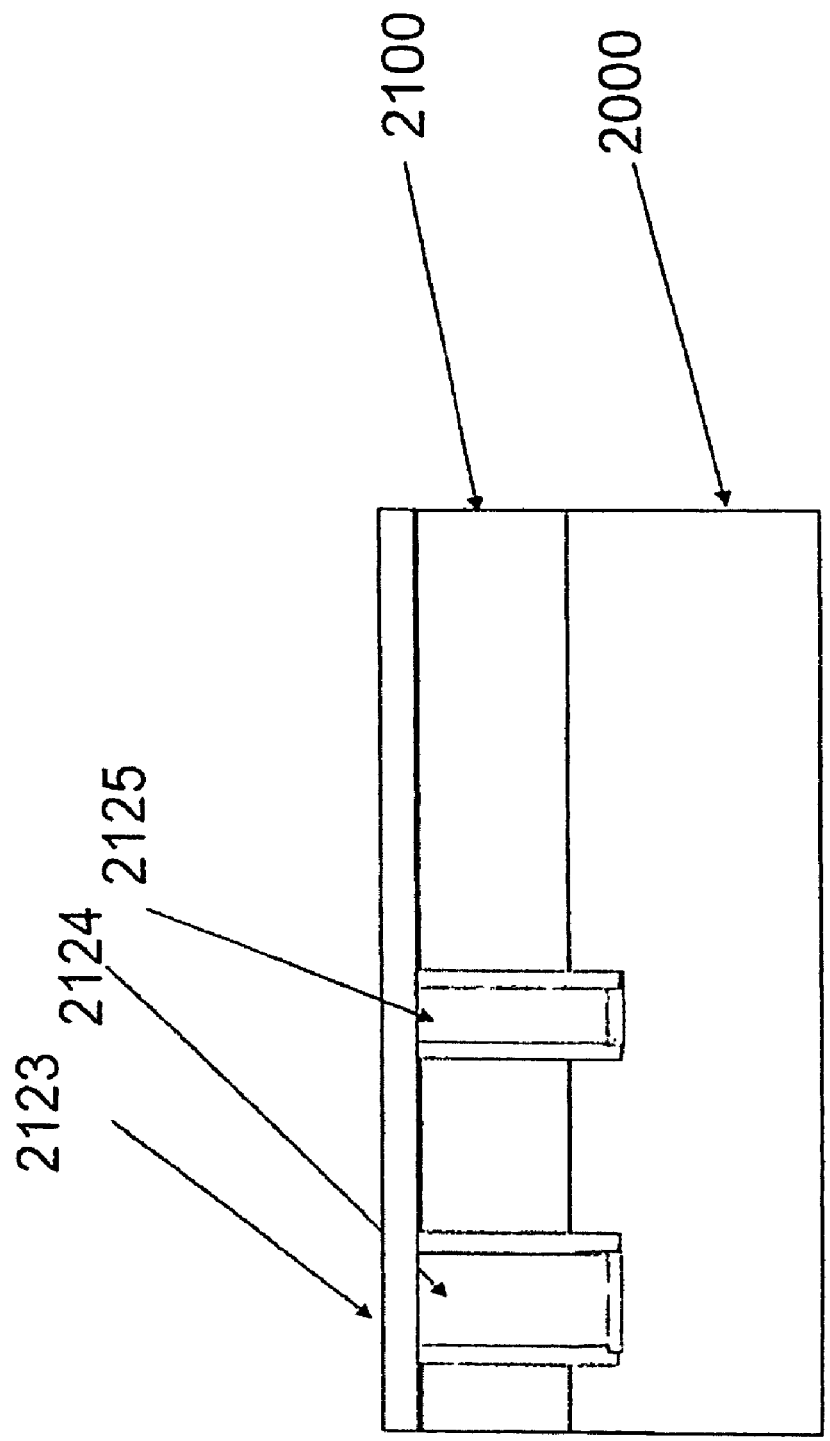
Figure 4:
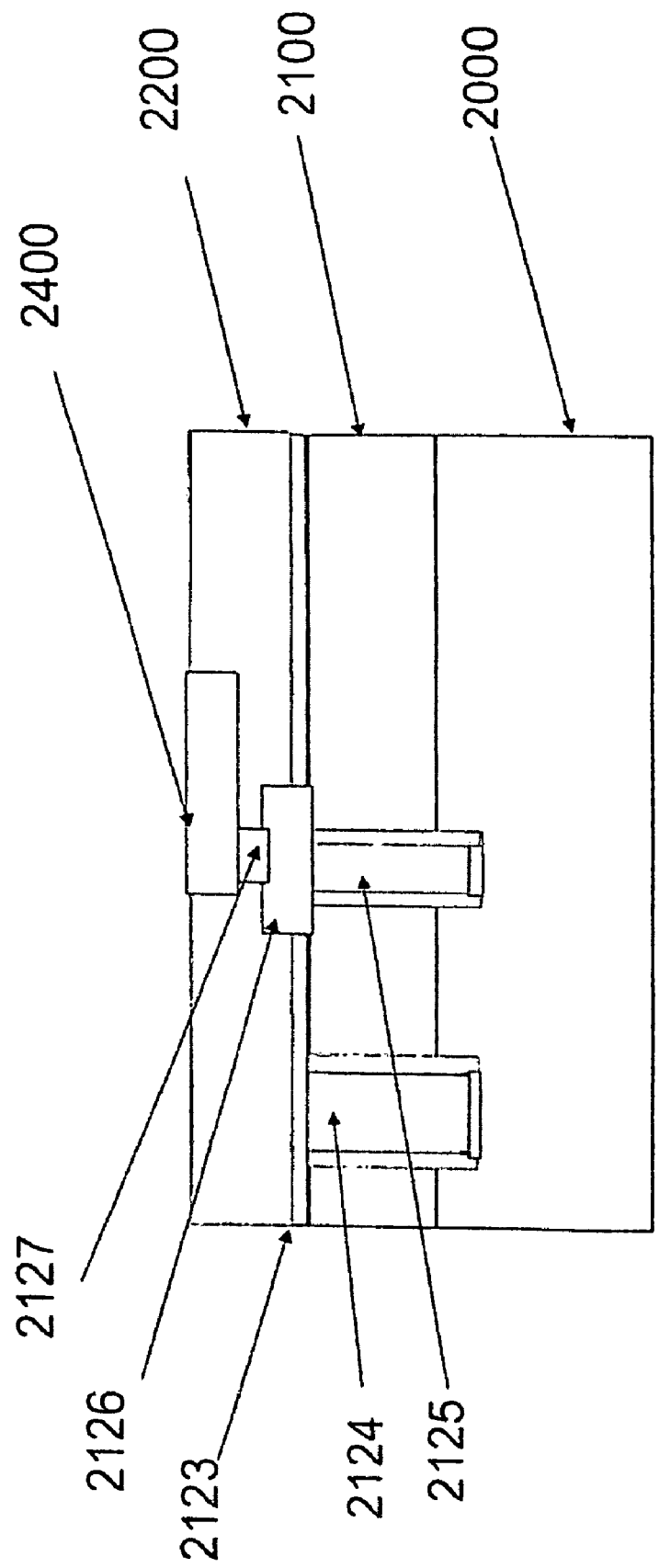
Figure 4:
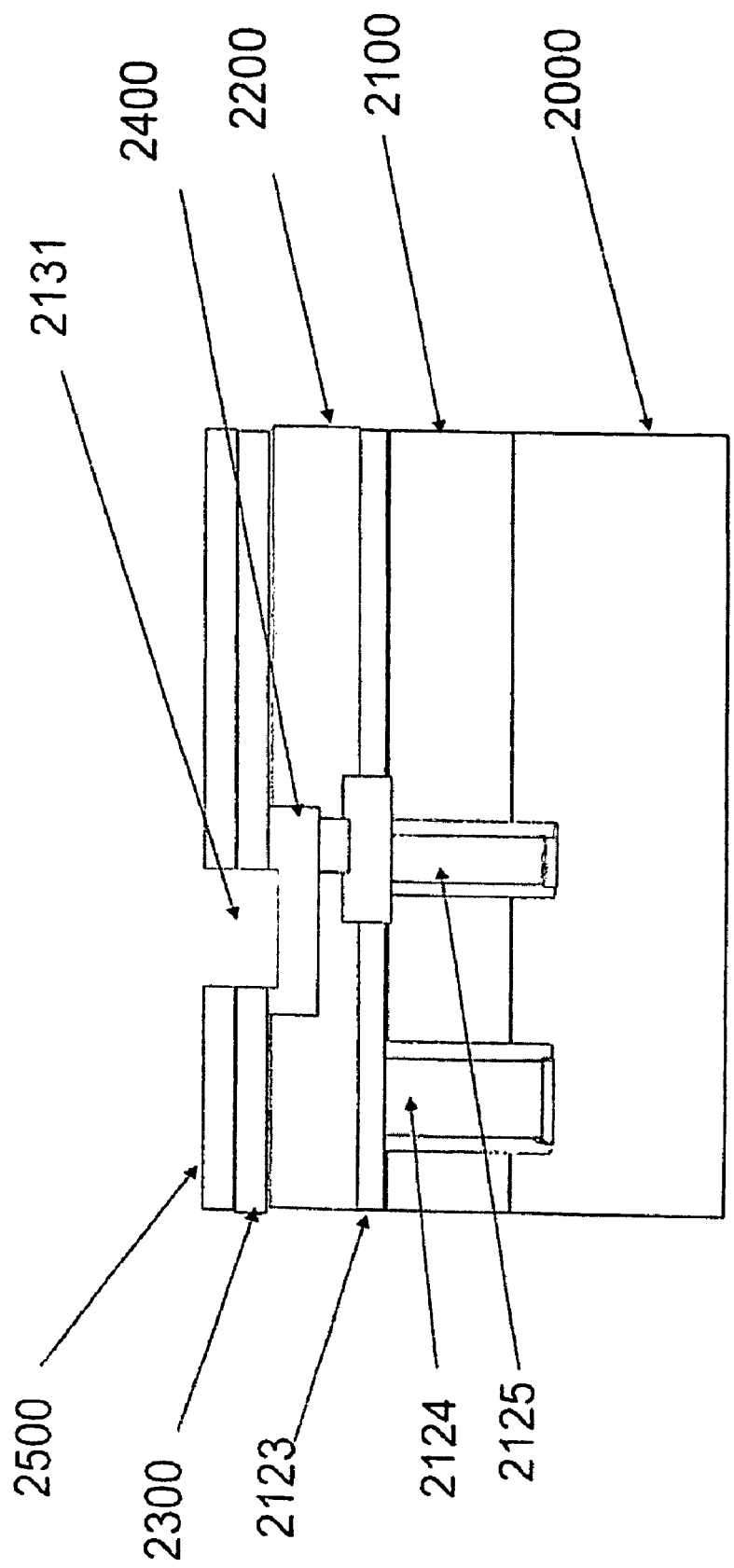
Figure 4:
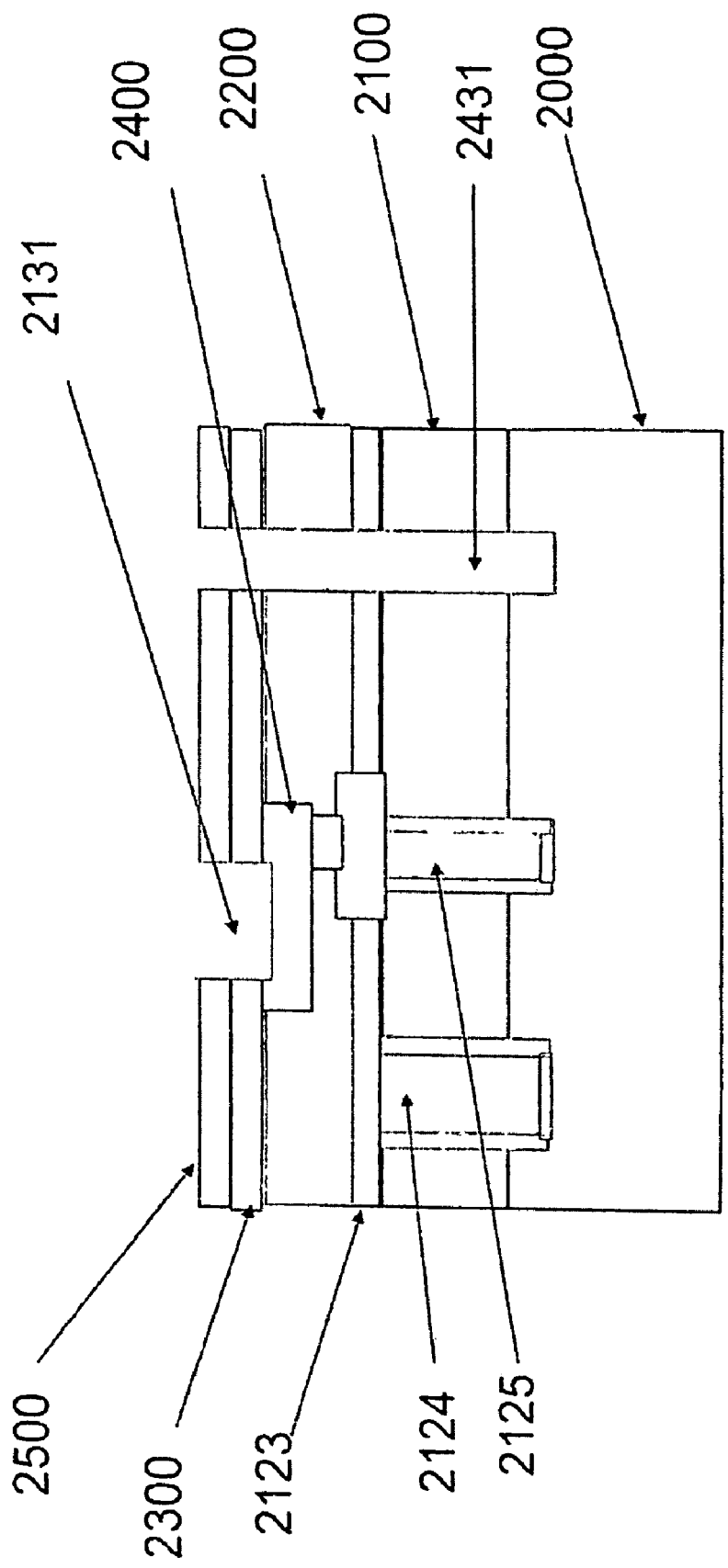
Figure 4:
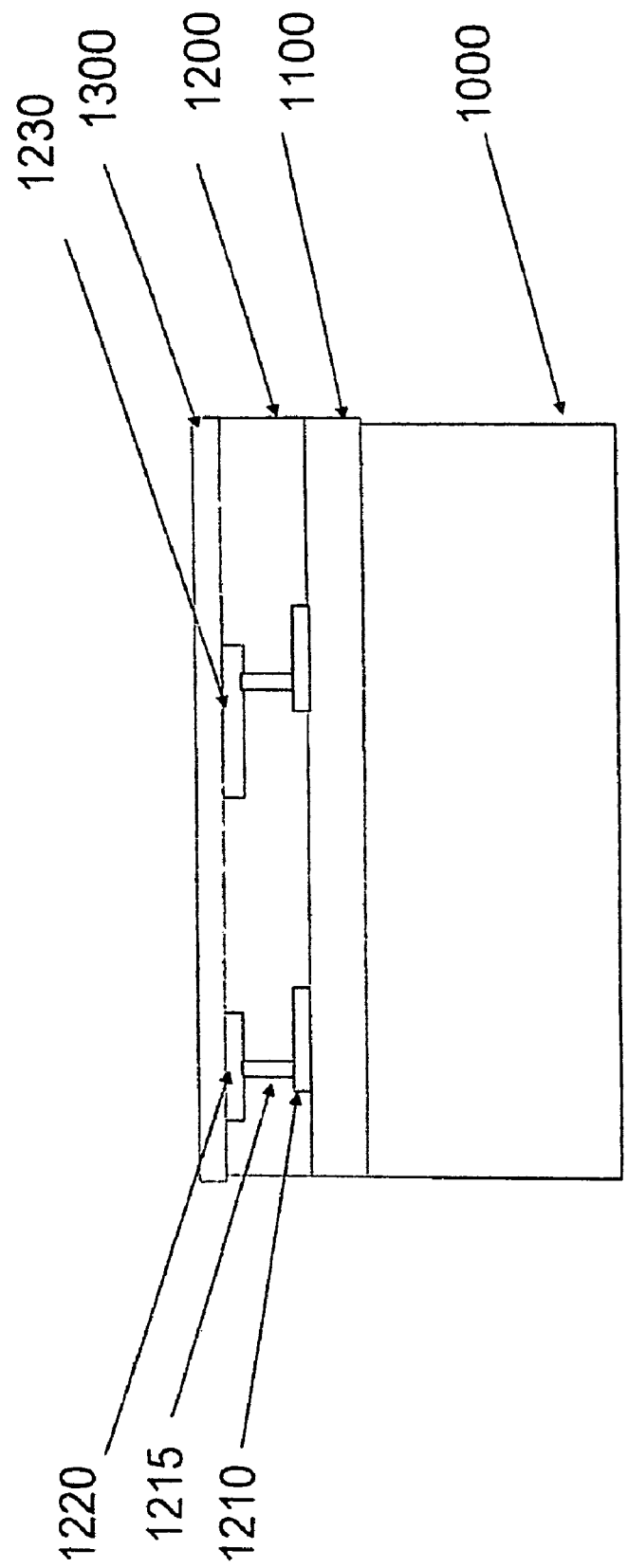
Figure 4:
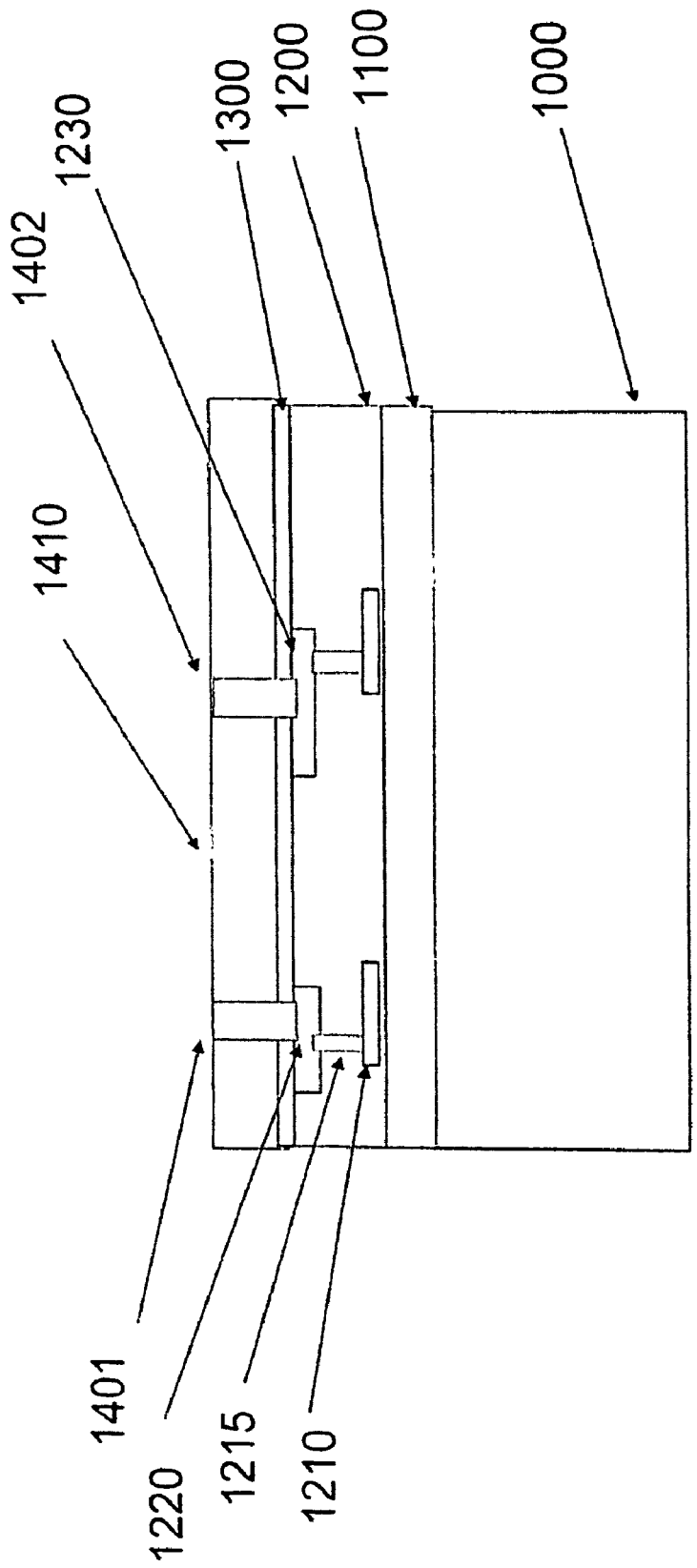
Figure 4:
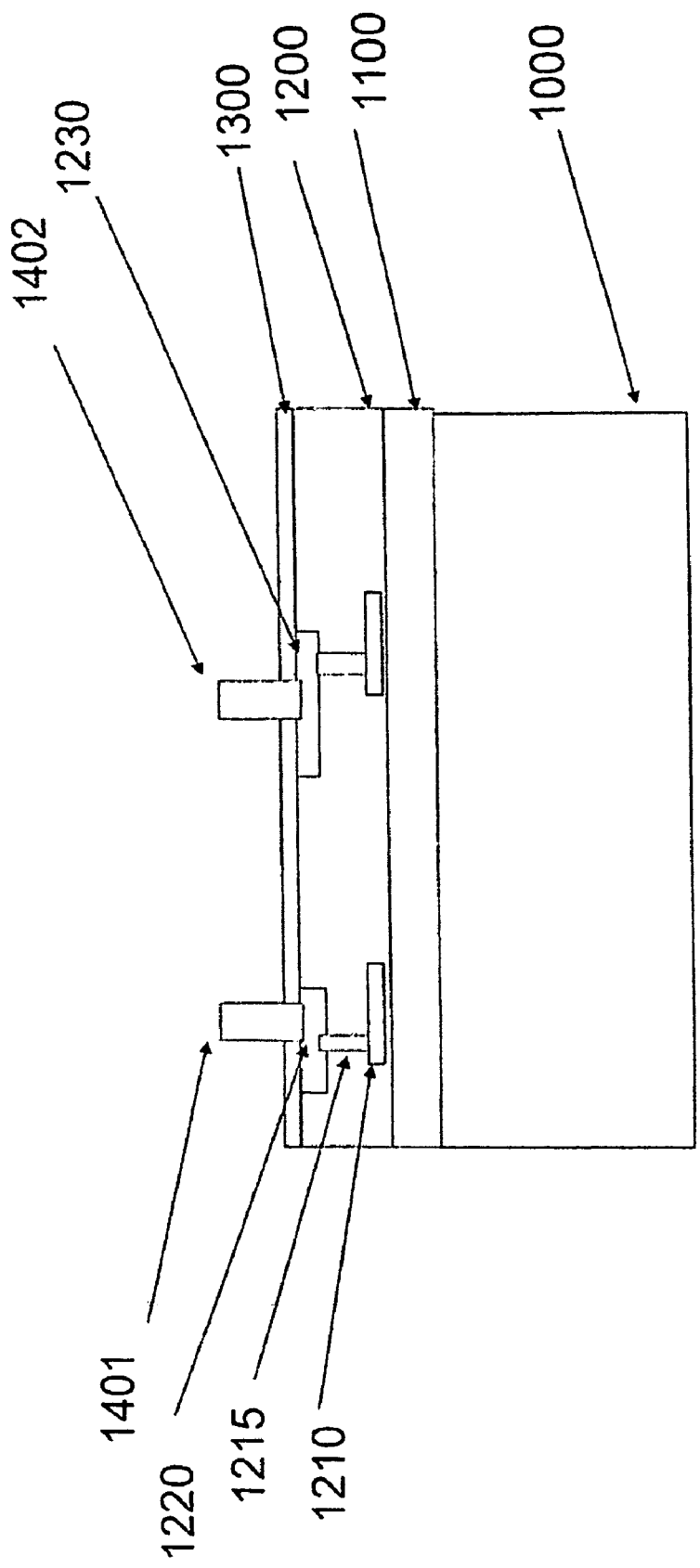
Figure 4:
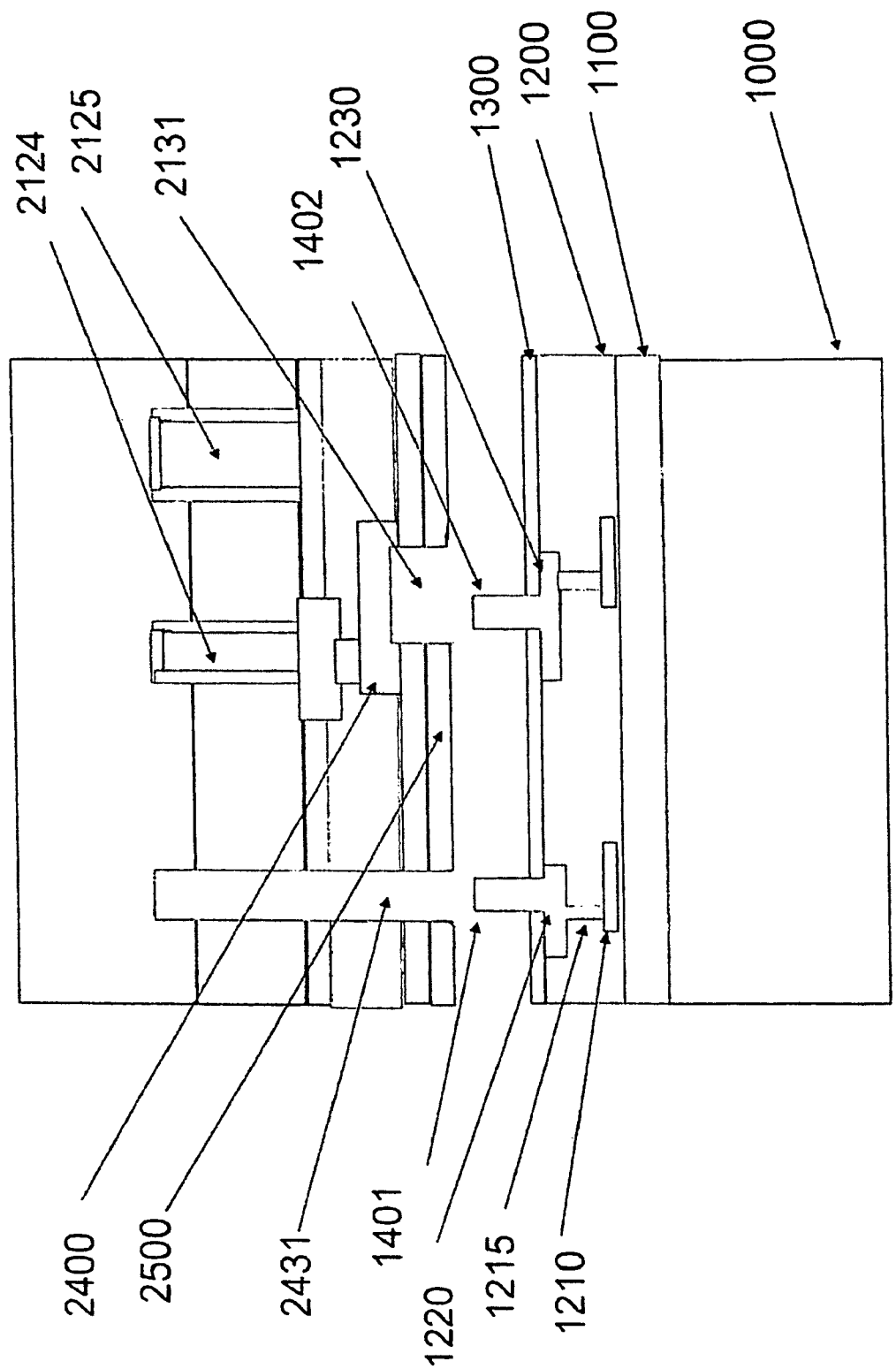
Figure 4:
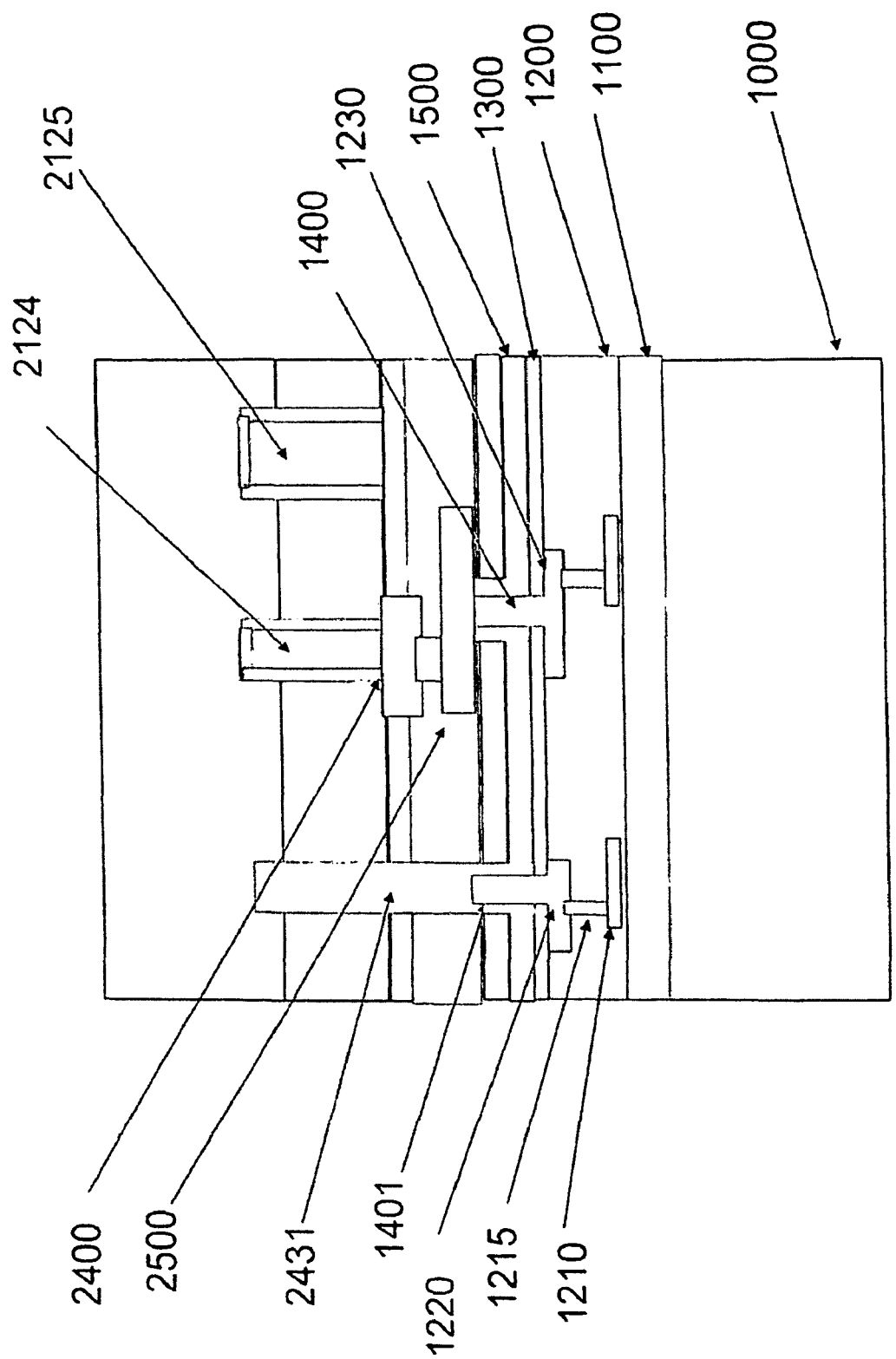
Figure 4:
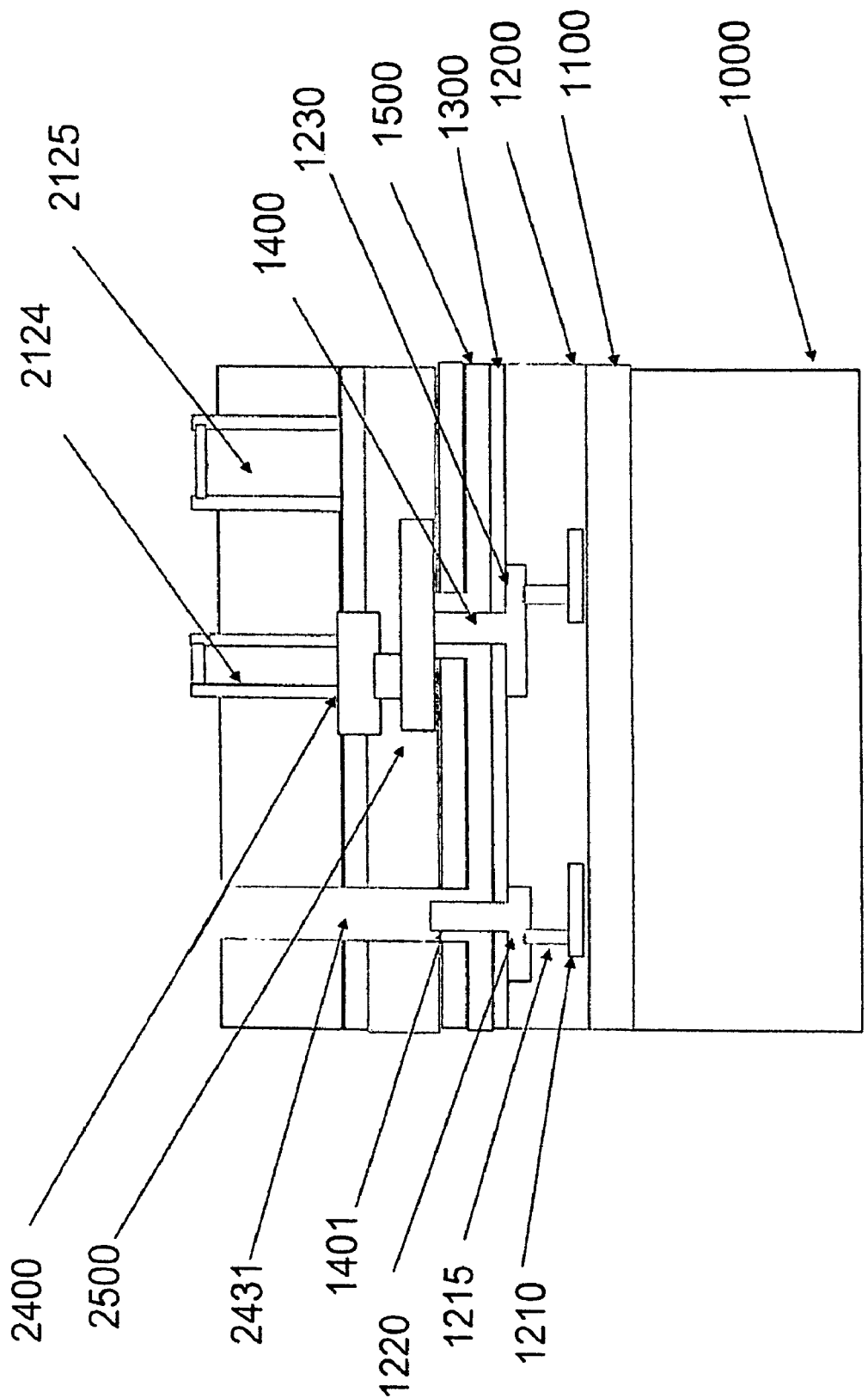
Figure 4:
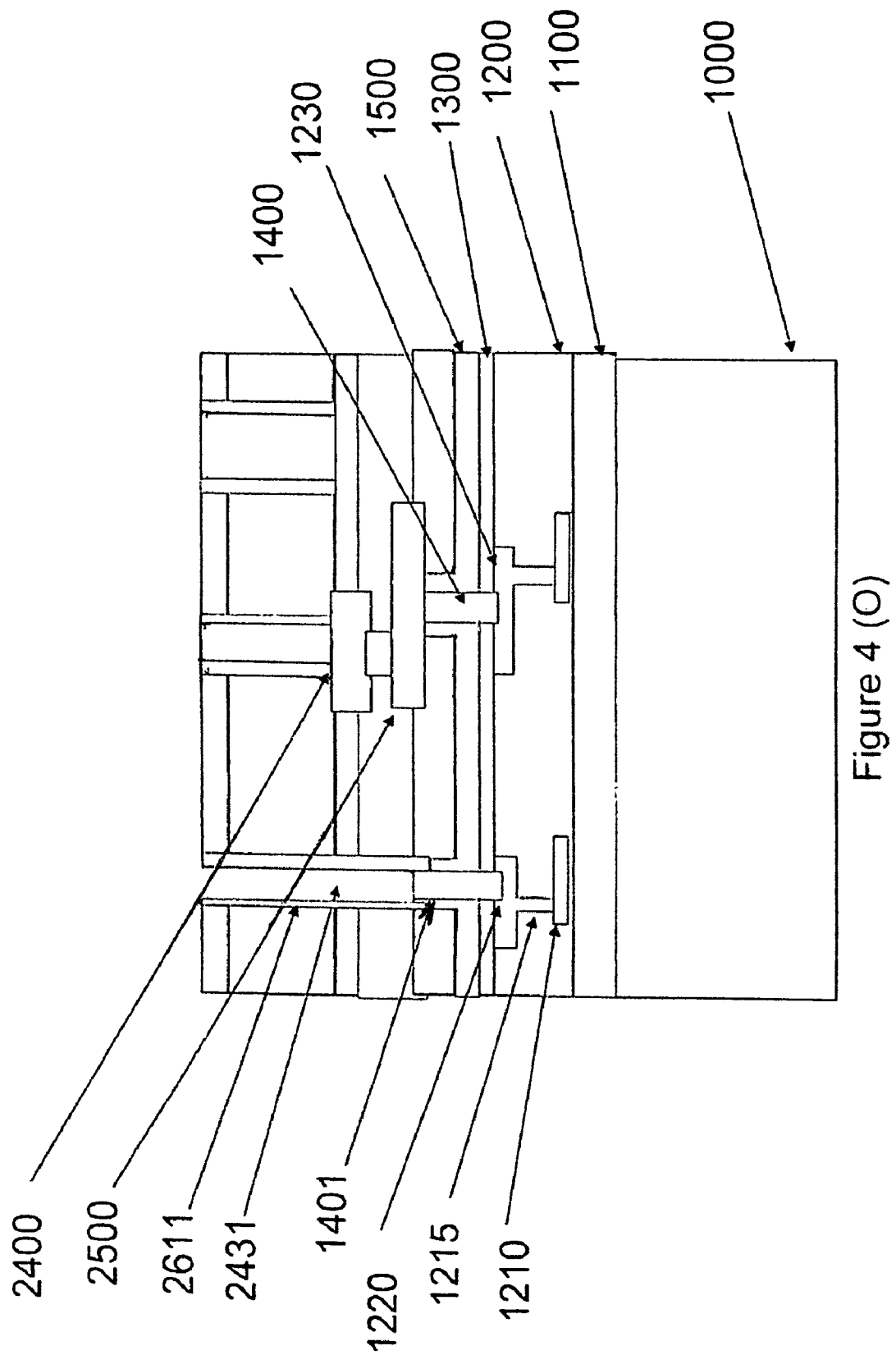
Figure 4:
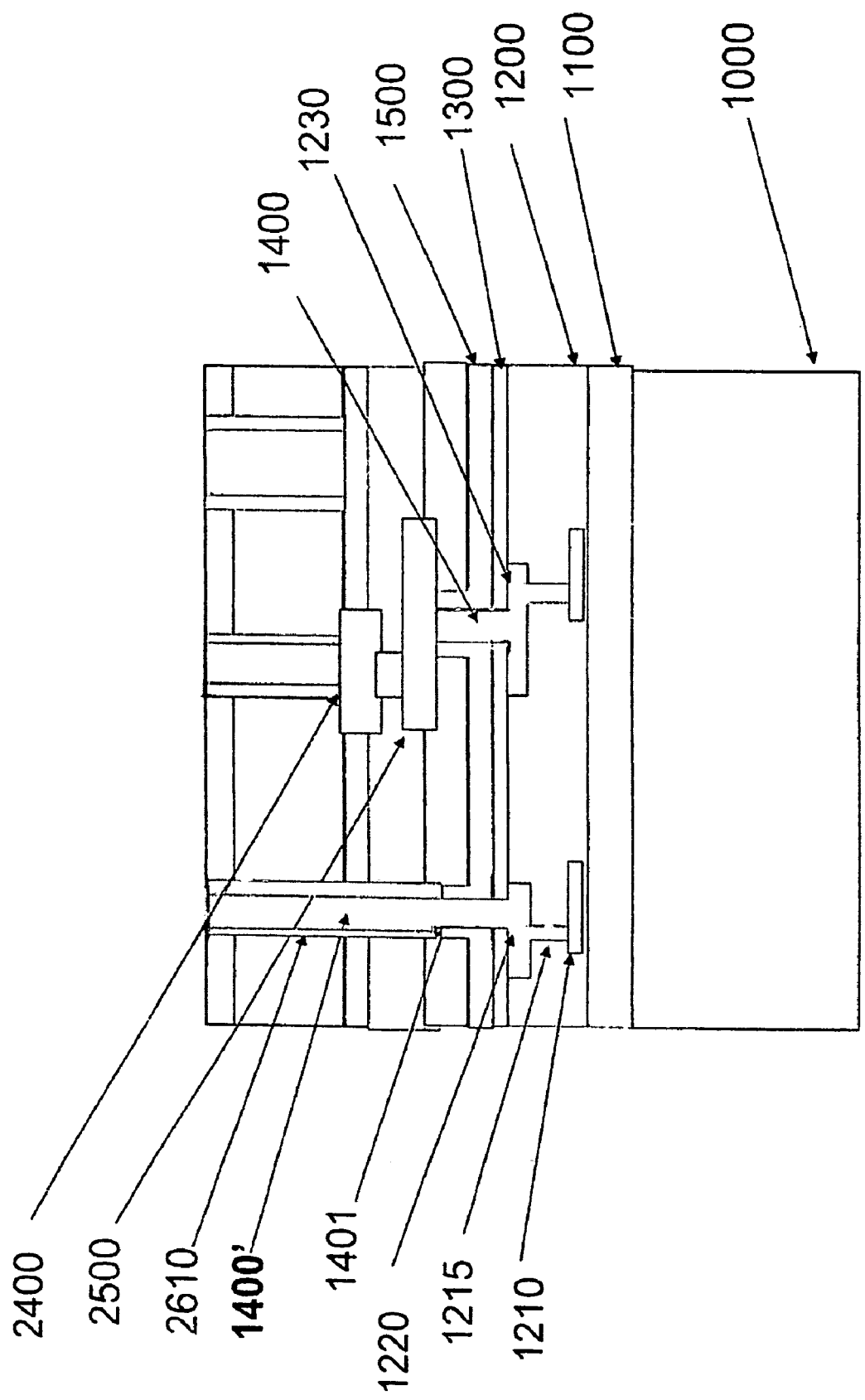
Figure 4:
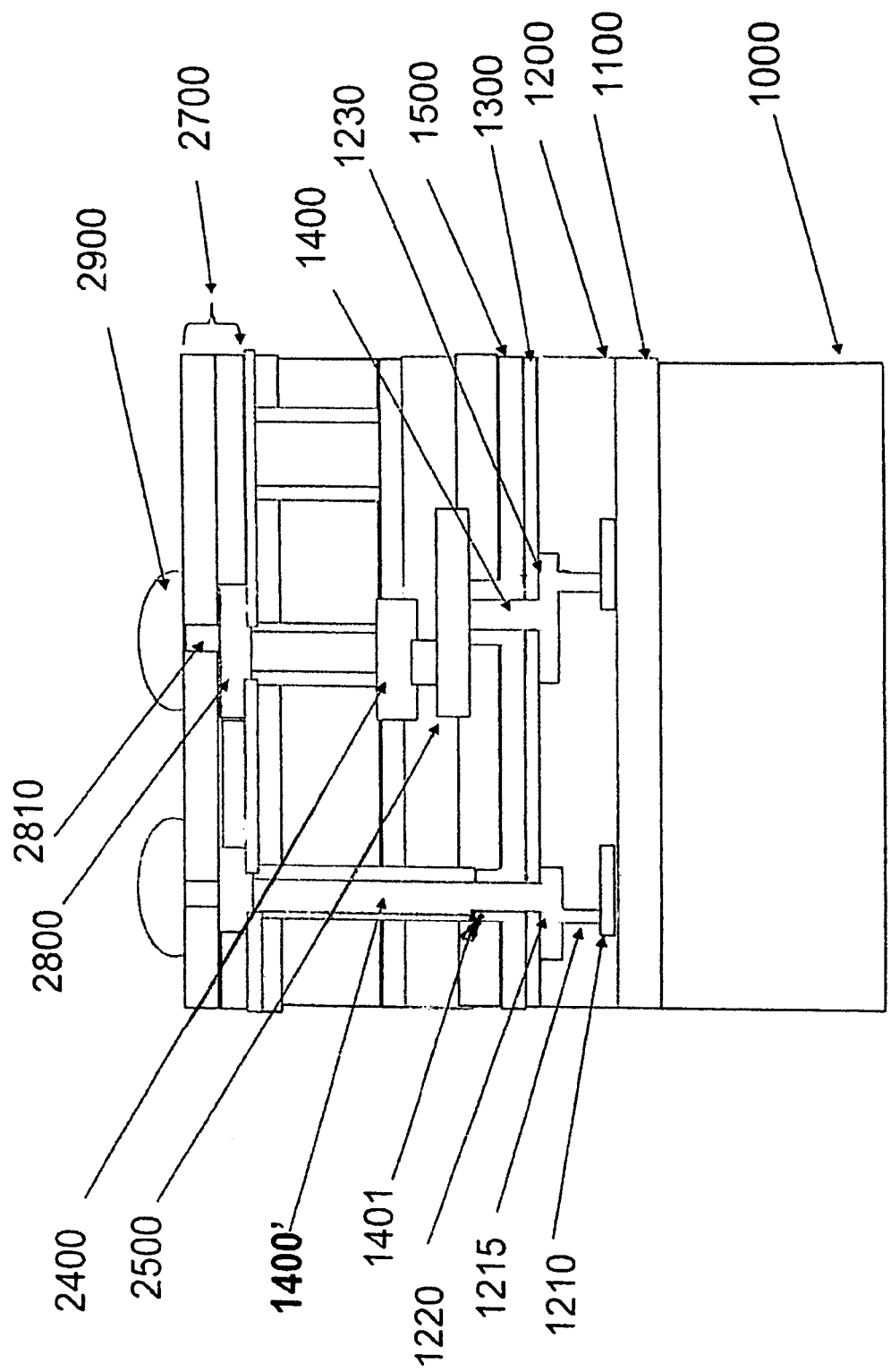

The following inventive method is employed to achieve the embodiment of the present invention shown in FIG. 2. FIGS. 4(A) through 4(M) depict one inventive sequence for fabricating this structure. FIG. 4(A) depicts the starting point for the device wafer to be thinned subsequently. The wafer at this stage comprises all the device circuitry and local interconnects between those circuits collectively designated as 2100 disposed on the silicon substrate 2000. The circuits comprise any one of logic circuits, memory circuits, controller circuits, image processing circuits, optoelectronic circuits and combinations thereof. Two dielectric hard mask layers 2100 and 2110 are applied on top and a photoresist 2130 is coated and patterned to form openings 2131 as shown at locations where through vias will be subsequently formed. Hard mask layers 2110 and 2120 are chosen advantageously from materials such as those comprising one of silicon oxide, silicon nitride and the like, i.e., equivalents thereof, and can be deposited by a suitable process such as plasma enhanced CVD. Next a through via pattern is transferred from the resist into the hard mask layers from the resist and then etched into the layers of 2100 and to a predetermined depth into the silicon substrate 2000. Provision is made by prior design to ensure that these vias are situated in such a way that they do not intersect any active interconnects, contacts or device regions. The depth of etch into the substrate 2000 is chosen based on the desired final thickness of this layer after bonding an thinning to be described later. After the via etch, the resist is stripped using a suitable dry or wet strip or a combination thereof. The resulting structure is shown in FIG. 4(B).

In the next step a conformal dielectric passivation layer 2122 is deposited to cover and passivate all of the exposed sidewalls and bottom surface of the through vias while also coating the top surface of the hard mask 2120 as shown in FIG. 4(C).

Passivation dielectric 2122 and the other equivalent layers disclosed and described herein can be deposited by CVD, PECVD or ALD processes. The primary function of this layer is to ensure that the sidewalls of the vias 2121 are fully covered and passivated so that any conductive fill to be applied to the vias in later steps does not interact with the silicon substrate or the features contained in layers 2100. It also acts to seal off any environmental ingress through the sidewall during subsequent processing steps or in the final assembled structure.

Next, the vias are filled with a conductive fill material and planarized to form filled vias 2124 and 2125 as shown in FIG. 4(D). The fill material comprises an electrically conductive material, such as Al, Mo, W, Cu, Au, Ag, Pd, Pt, Ni, or combinations thereof with one another, which includes alloys or mixtures thereof, or alloys or mixtures thereof with equivalent elements, or equivalent mixtures, alloys and elements. Optional adhesion layers or diffusion barriers (not shown) may also be used if the fill material requires it. Sputtering, evaporation, CVD, ALD, plating and combinations thereof can be used to accomplish the fill process and chemical mechanical polishing (CMP) used to planarize and remove the excess of the fill material from the top. The hard mask layers are also removed by this CMP Process. The filled and planarized structure is capped off with a second passivation dielectric 2123.

Next, several processing steps are performed to fabricate additional back end of the line (BEOL) wiring levels and connections required to further interconnect the circuits in the device layer and to make contact with the filled through vias of the type 2125 as shown in FIG. 4(E). The BEOL interconnect is collectively designated 2200 in FIG. 4(E). Details of all the wiring in this ensemble layer are not shown for the sake of clarity except for contact pads 2126 connecting to through vias 2126, which are connected to joining pads 2400 by vias 2127. The connection scheme 2126-2127-2400 is for simple illustration only and is not meant to be exclusive. For example, depending on the number of layers of wiring and complexity of the interconnect ensemble 2200, connection from contact pad 2126 to the joining pad 2400 may require additional vias and lateral escape wiring contained in the various layers of ensemble 2200. Filled vias 2124 are not electrically connected to the BEOL interconnect ensemble 2200 and as will be seen later is used only as alignment marks for pattern placement steps required after bonding and thinning. The various features 2126, 2127 and 2400 are made of conductive materials such as copper using the typical damascene type processing known in the current art.

Next a passivation dielectric 2300 and an adhesive 2500 are applied on top of the structure of FIG. 4(E) and using suitable photolithography and etching patterned and etched to form the first openings 2131 to the contact pads 2400. The passivation layer 2300 is intended to act as a diffusion barrier and passivation for the copper pads and other copper features that are present on the top. Material for the adhesive layer 2500 in some embodiments comprises a thermoset or thermoplastic polymer which has a good adhesion to the passivation dielectric 2300 and is capable of forming a strong bond to the second wafer (to be described later) under a lamination process involving elevated temperature and pressure. This material should be thermally stable and nonreactive with any exposed surfaces of pads 2400. The adhesives comprise polyimides, epoxies, polyarylene ethers and combinations thereof or equivalent adhesives for adhesive layer 2500 and the specific choice is determined by the thermal budget required for bonding and subsequent post bonding processes. The lamination is performed using one of a parallel plate platen pressure and isostatic gas pressure applied using a flexible conformal diaphragm, all of which is generally known in the art.

In the next step, using a second lithography and an etching step, deep via openings 2431 are etched into the layers 2500, 2300, 2200, 2123, 2100 and partly into substrate 2000 as shown in FIG. 4(G). It is desirable that the etch depth of 2431 into substrate 2000 is the same as or greater than for the filled through vias 2124 and 2125. As will be noted later, these deep via openings will serve as the "lock" features in the lock and key arrangement of this inventive structure and its various embodiments. This completes the minimum processing sequence required for the device wafer that is to be subsequently thinned.

The other device wafer which will be used without thinning is depicted schematically in FIG. 4(H). This wafer is shown here after the device and all the interconnect layers have been completed. In particular, at this stage it comprises a substrate 1000, a device and local interconnect ensemble region 1100, an interconnect ensemble layer 1200 protected on top with a passivation dielectric layer 1300.

Although most of the internal layer details of the interconnect ensemble 1200 have been omitted from FIG. 4(H) for the sake of clarity, two sets of contact pads 1220 and 1230 and via connections 1215 and internal terminations 1210 are shown for the sake of further discussion. As described earlier, the depiction of the features 1210 and 1215 are schematic and actual structures containing many more layers of wiring planes and vias can be utilized without deviating from the spirit of the current inventive method and structure.

In the next sequence of processes a set of conducting studs 1401 and 1402 are formed in a sacrificial dielectric medium 1410 using damascene processes known in the art. Studs 1401 and 1402 in some embodiments are made of copper. The sacrificial dielectric 1410 can be organic or inorganic and the key requirement being compatibility with ease of damascene copper processing and ease of subsequent removal (next step) with no damage to the studs 1401 and 1402 and the underlying passivation layer 1300. Material for layer 1410 comprises one of silicon oxide, spin on glasses and organic polymers such as polyimides and polyarylene ethers and combinations thereof or equivalents. The wafer structure at this point is shown in FIG. 4(I).

Next the sacrificial dielectric 1410 is removed leaving the studs 1401 and 1402 protruding above the passivation layer 1300 as shown in FIG. 4(J). Wet etch, plasma etch or combinations thereof can be used to remove the sacrificial layer 1410 without degrading the studs 1401 and 1402 and the passivation layer 1300. The studs 1402 serve as the "key" feature in the lock and key arrangement of the present inventive structure and its various embodiments to be described subsequently in this application.

In the next step, the device wafer to be thinned is flipped over and aligned over the other wafer as shown in FIG. 4(K). Alignment can be performed using split optics vision systems capable of viewing fiducial marks on the two matching surfaces or by using through wafer viewing by infrared microscopy. The alignment process enables the insertion of the studs 1401 into the deep vias 2431 and the studs 1402 into the openings 2131 above the bonding pads 2400 in the device wafer to be thinned.

In the next step the two wafers are brought into physical contact and subjected to an isostatic pressure lamination process at an elevated temperature to enable bonding. During this process studs 1402 get intimately bonded to contact pads 2400 forming a joined structure 1400 as shown in FIG. 4(L). The lamination is performed using one of a parallel plate platen pressure and isostatic gas pressure applied using a flexible conformal diaphragm all of which is generally known in the art. The adhesive 1500 flows during this step bonding the two wafers together and filling any gaps between the wafers including gaps surrounding the studs 1401 and the joined structure 1400. Typical bonding temperatures can be between about 200° C. and about 450° C. and more preferably between about 300° C. and about 400° C. Isostatic pressure is best generated using a gas pressure applied through a diaphragm as previously known in the art and pressures in the range of about 50 psi to about 500 psi can be used or about 50 to about 100 psi. The use of isostatic pressure affords a uniform distribution of the applied loading that enables reliable bonding over large bonding areas such as those required in the present application.

In the next step almost all of the body of the substrate 2000 are removed by a suitable combination of grinding, polishing, wet or dry etching exposing the back of the filled through vias 2124 and 2125 as shown in FIG. 4(M). Studs 1401 are inserted and are accessible through the through via openings 2431 at this point.

Next a conformal passivation dielectric 2510 is deposited to passivate the through via openings 2431 and covering the top surface of the bonded structure as well as shown in FIG. 4(N).

Subsequently a blanket etch back of layer 2510 is performed by a directional reactive ion etch process to remove it from the top surface regions and the bottom of the through via opening 2431 so that the top surface of the studs 1401 are exposed and a sidewall coating 2610 is only left of the original layer 2510. This is shown in FIG. 4(O).

Next the through via 2431 is filled with a conductive material and planarized to form a filled via 1400' as shown in FIG. 4(P). The conductive fill comprises copper in one embodiment and may be applied using processes known in the art for damascene processing. Additional coatings in the fill comprise adhesion/diffusion barrier films such as Ta or TaN (not shown) and equivalents will also be applied as part of the fill separating the copper from the passivation layer. Other fills comprise an electrically conductive material, such as materials comprising Al, Mo, W, Cu, Au, Ag, Pd, Pt, Ni, or combinations thereof with one another, which includes alloys or mixtures thereof, or alloys or mixtures thereof with equivalent elements, or equivalent mixtures, alloys or elements.

In the last sequence, an ensemble of additional BEOL interconnects 2700 are built up on top and input/output terminals 2900 are formed to complete the fabrication sequence. The resulting final structure is schematically shown in FIG. 4(Q). Exemplary vias 2810 and lines 2800 are shown as part of the interconnect ensemble 2700. Actual structure of this ensemble may comprise more layers of vias and lines as required without deviating from the spirit of this inventive method and structure resulting there from. Input output terminals can be solder contacts but could also be pads suitable for wire bond connections or combinations thereof. The structure so achieved and shown in FIG. 4(Q) is the same as the inventive structure of the embodiment shown in FIG. 2.

Figure 3:
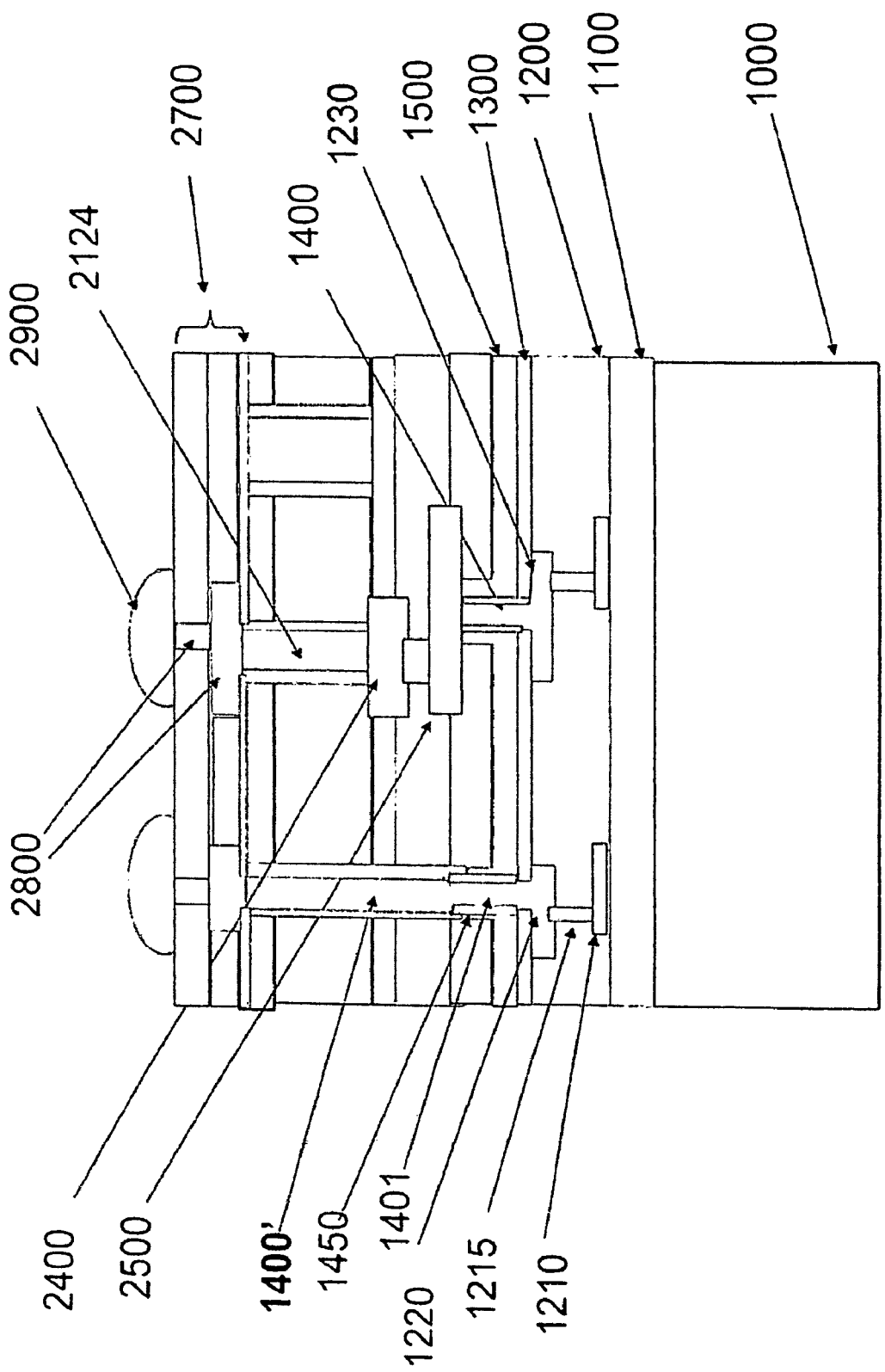
FIG. 3 comprises a side elevation in cross-section showing an inventive 3D device stack structure according to another embodiment of the present invention.

The following inventive sequence of processes is employed to fabricate the inventive structure shown in FIG. 3. First all the steps described in the first inventive method above and depicted in FIGS. 4(A) through 4(G) are carried out to produce the first device wafer (later to be bonded and thinned). The resulting structure shown originally in FIG. 4(G) is reproduced for convenience as FIG. 5(A).

Next, all the process steps described in the first inventive method and depicted in FIGS. 4(H) through 4(J) for fabricating the second device wafer are completed to produce the structure shown in FIG. 4(J) which is reproduced for convenience as FIG. 5(B).

Next a conformal passivation coating 1449 is formed to protect the exposed surfaces of studs 1401 and 1402 as shown in FIG. 5(C). The passivation coating can be electrically conductive comprises one of gold, nickel, cobalt, tin, tungsten, and or combinations thereof with one another, which includes alloys or mixtures thereof, or alloys or mixtures thereof with equivalent elements or equivalent mixtures, alloys or elements. Selective CVD deposition of tungsten or electroless deposition of gold, nickel, cobalt, tin, or alloy such as Ni—P, Co—P, Co—W—P (where W stands for tungsten and P stands for phosphorous) comprise processes and compositions or compounds or elements for this conductive passivation coating. It is important that the conducting passivation layer is not present in the regions between the studs on the dielectric layer 1300 as this will result in electrical leakage or shorting which is undesirable.

In the next step the first device wafer processed as shown in FIG. 5(A) is flipped over an aligned to the second device wafer as shown in FIG. 5(D). Alignment procedures described in the first inventive method can be used for achieving the desired alignment.

The aligned wafers are then bonded together as in the first inventive method using an isostatic lamination procedure resulting in the structure shown in FIG. 5(F). Passivation material located at the top of studs 1402 is incorporated within the bonded stud 1400 during this process as shown in this figure. This incorporated portion of the passivation material which is one of the various conductive layers described above can be present in its original form or it may become alloyed and/or intermixed with the conductive material of the stud metallurgy described earlier.

This is followed by the thinning of the first device wafer and deposition of a passivation dielectric 2510, as shown in FIG. 5(G) using the steps described in the inventive method set out in FIG. 2.

Next the passivation dielectric is removed from everywhere except the sidewalls of the through via openings 2431, removing the passivation coating 1449 from the top of the studs 1401 and filling the through via holes 2431 with a conducting filler material to form filled through via 1400' again using procedures described in the inventive method set out in FIG. 2. At this point the conducting passivation layer now designated as 1450 is only present around portions of the sidewall regions the filled through via 1400' and the bonded studs 1402. This results in the structure depicted in FIG. 5(H). The composition of conducting passivation layer 1450 comprises the same materials described and disclosed herein for conductive passivation coatings and is applied in a manner known in the art.

Once again following the finishing steps described previously in the inventive method set out in FIG. 2, BEOL and input output terminations are fabricated on top of the bonded structure resulting in the final structure shown in FIG. 5(I). This structure is identical to the second inventive structure depicted in FIG. 3. The presence of additional sidewall passivation material 1450 differentiates this structure from the one shown in FIG. 2 and affords full environmental passivation of the fill material in 1400' and 1401.

Figure 6:
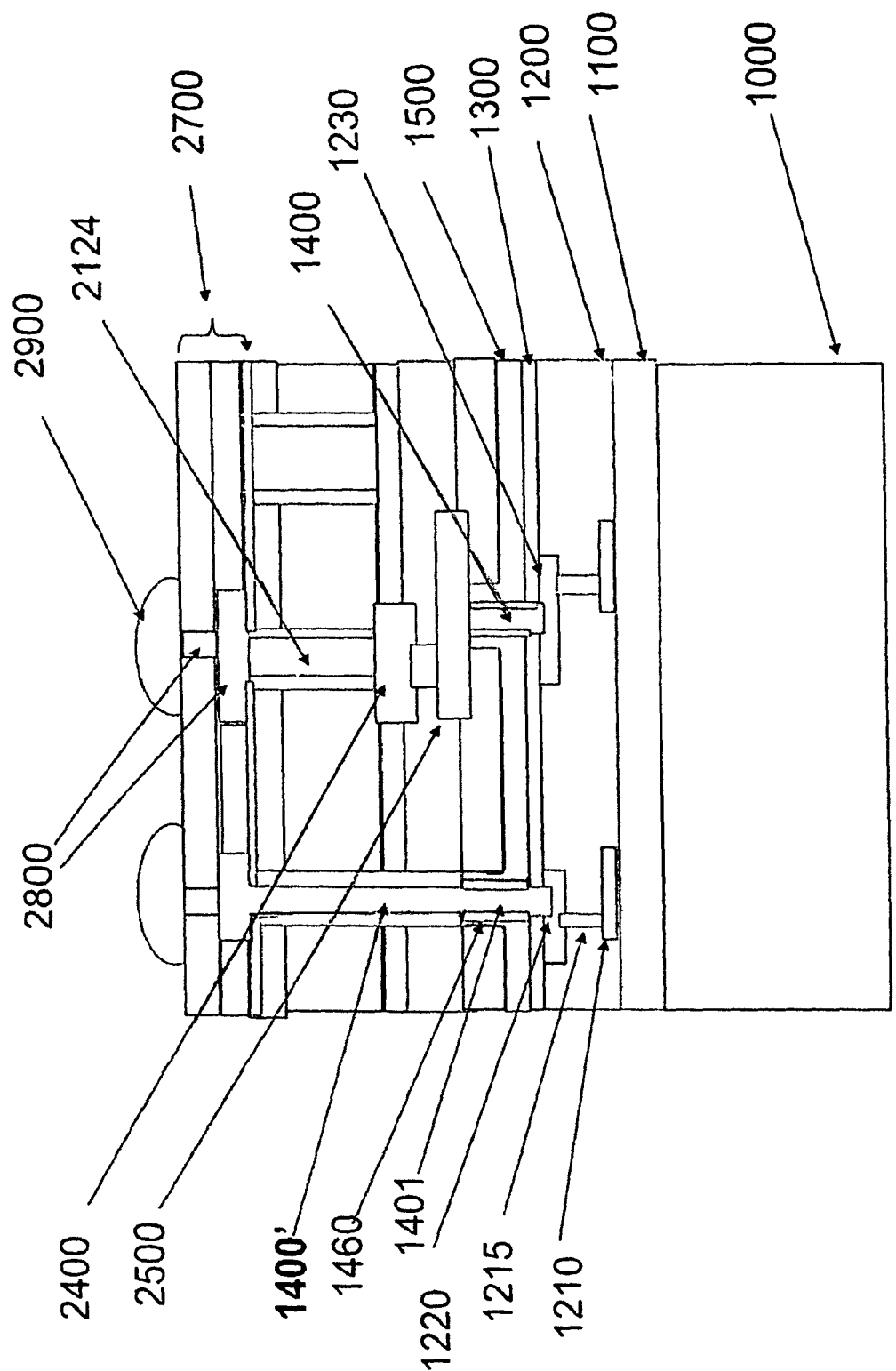
FIG. 6 comprises a side elevation in cross-section showing an inventive 3D device stack structure according to another embodiment of the present invention.

In a variant of the inventive structure illustrated in FIG. 3, the passivation material can be an insulator as shown in the structure of FIG. 6 which we call the third inventive structure and comprises passivation materials such as those comprising one of silicon nitride, silicon oxide, silicon carbide, silicon carbontride and combinations thereof with one another or equivalent elements or compounds or compositions. In FIG. 6, portions of the side wall region of the joined structure 1400 and the through via 1401 are passivated by an insulating passivation layer 1460. All other layer designations in FIG. 6 are same as those in FIG. 3.

An inventive method described below is utilized to achieve the inventive structure of FIG. 6. The process sequence is identical to the inventive method described for FIG. 3 up to the steps depicted in FIG. 5(B). This is reproduced for convenience as FIG. 7(A) retaining all the common layer designations from FIGS. 5(A) and 5(B).

At this stage a passivation dielectric 1470 is conformally coated over the top of the studs and the dielectric 1300 as shown in FIG. 7(B). Next dielectric 1470 is subjected to anisotropic etching by a process comprising reactive ion etching or directional ion milling or equivalent processes, to remove it from all flat surfaces resulting in dielectric sidewall passivation 1460 located only along the vertical sidewalls of studs 1401 and 1402 as shown in FIG. 7(C).

Figure 5:
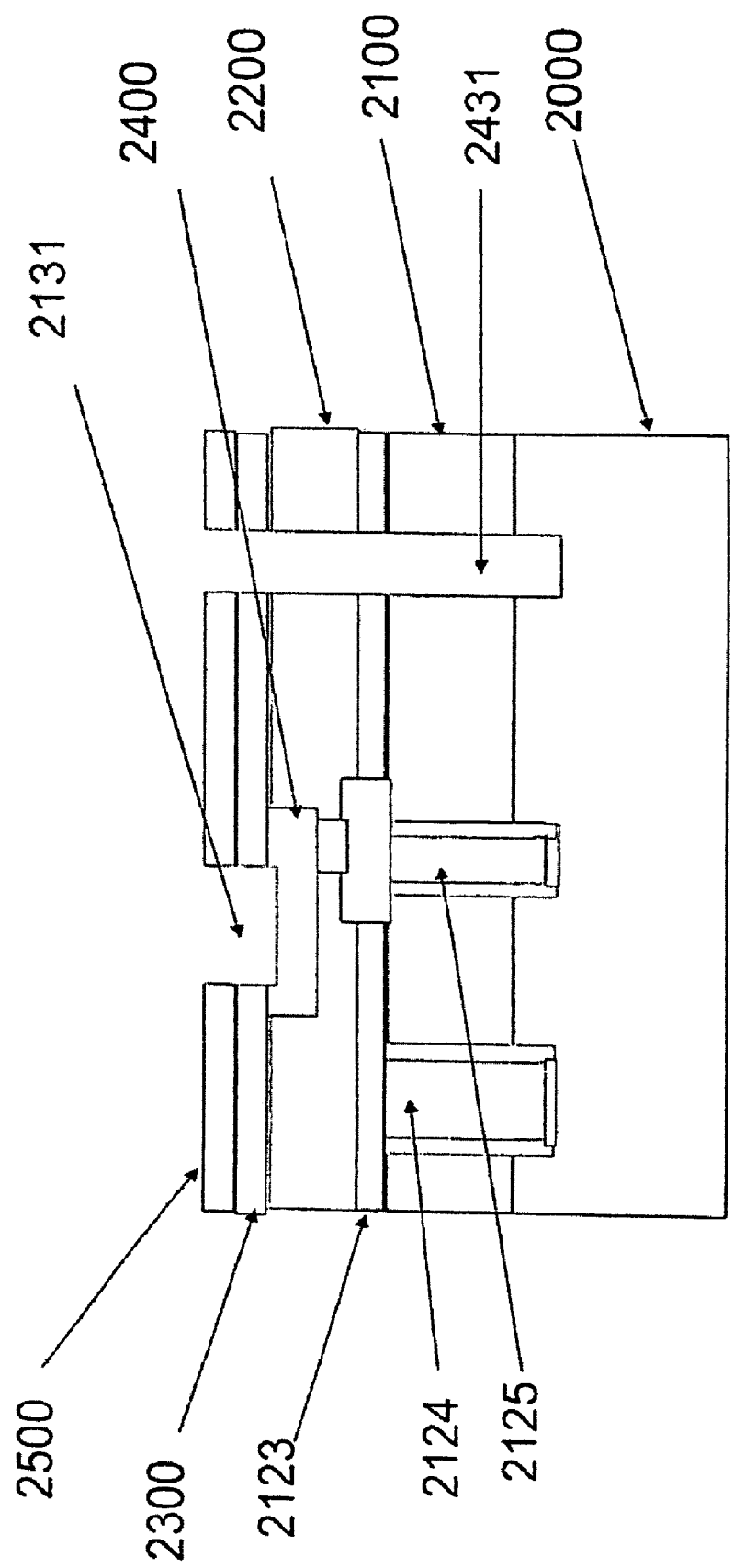
FIGS. 5(A) through 5(I) comprises side elevations in cross-section illustrating a schematic process flow for fabricating the inventive device stack structure of a further embodiment of the present invention.
Figure 5:
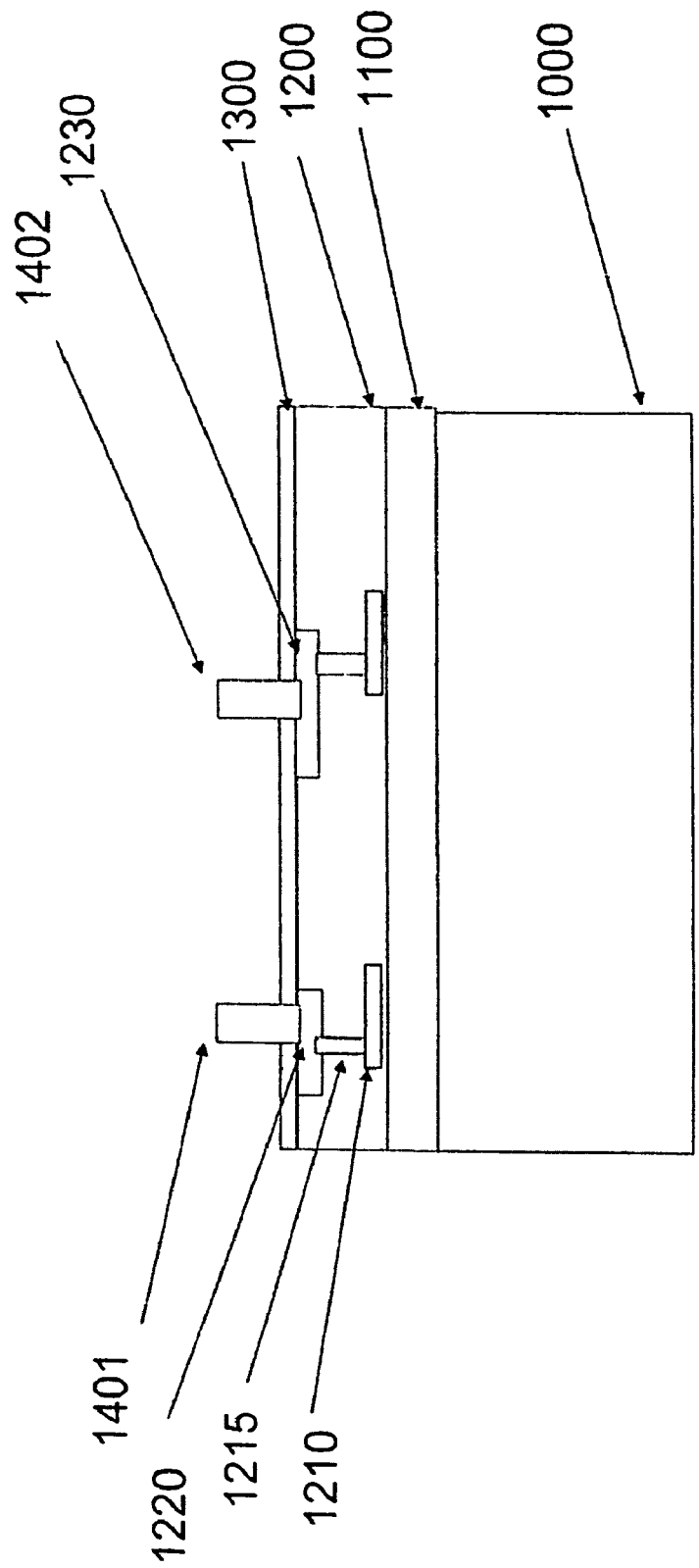
Figure 5:
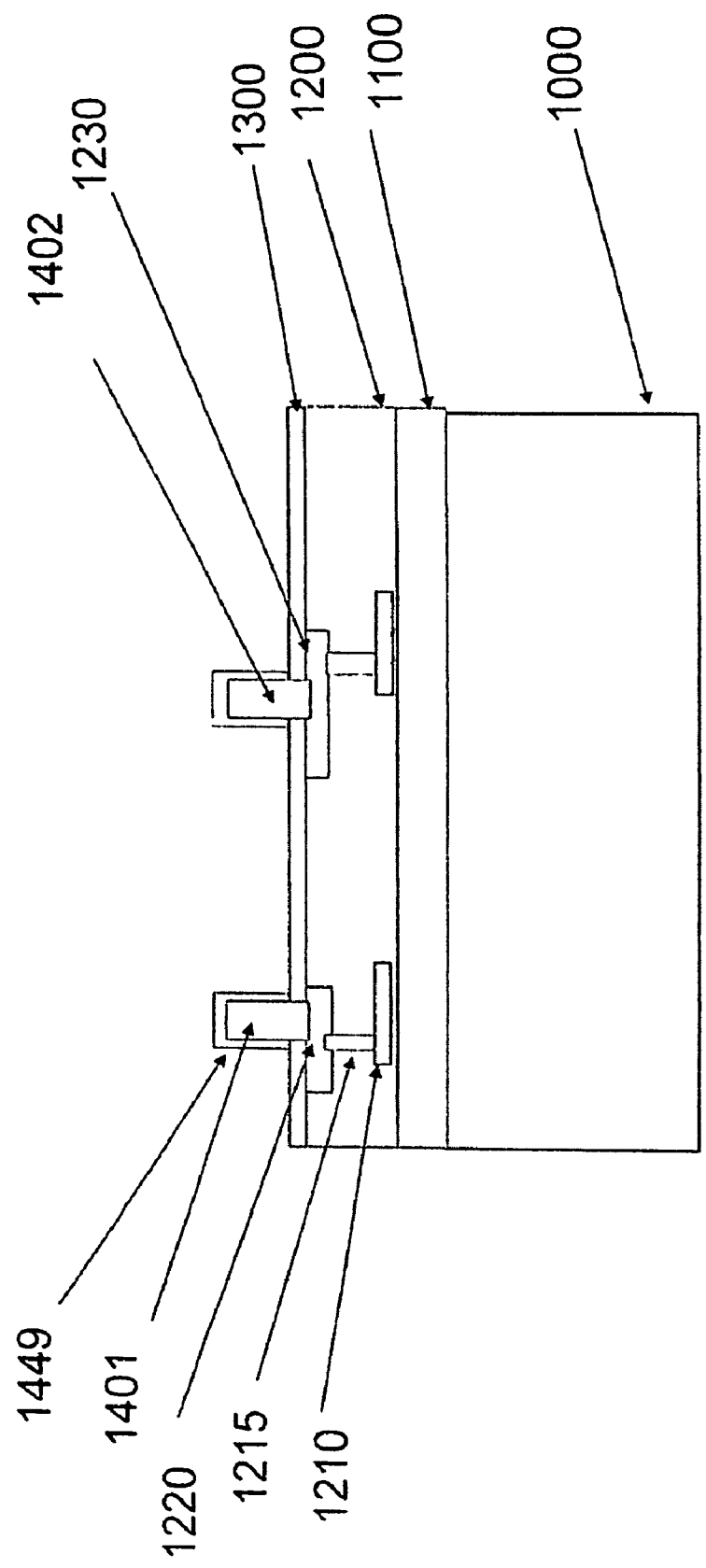
Figure 5:
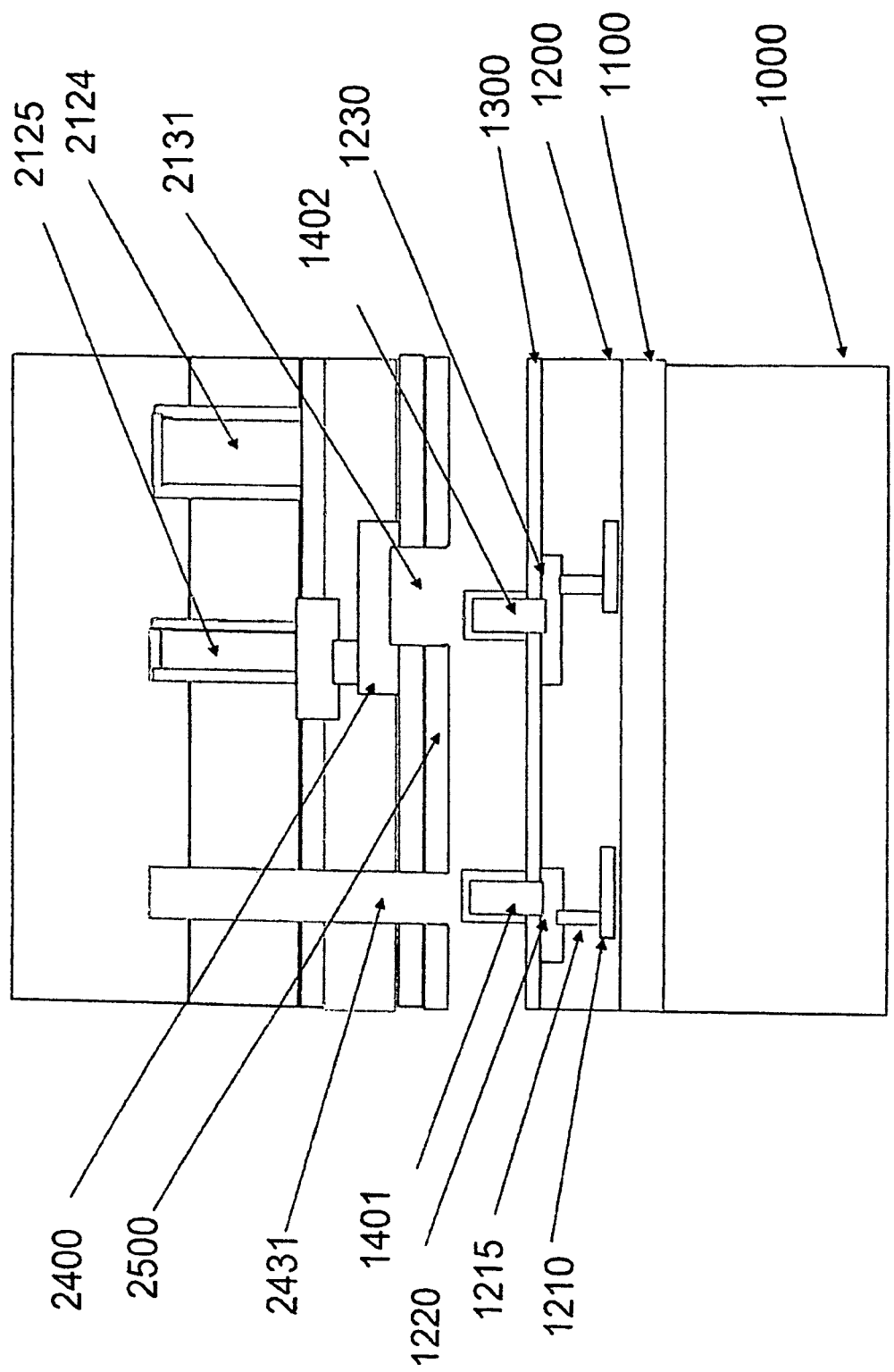
Figure 5:
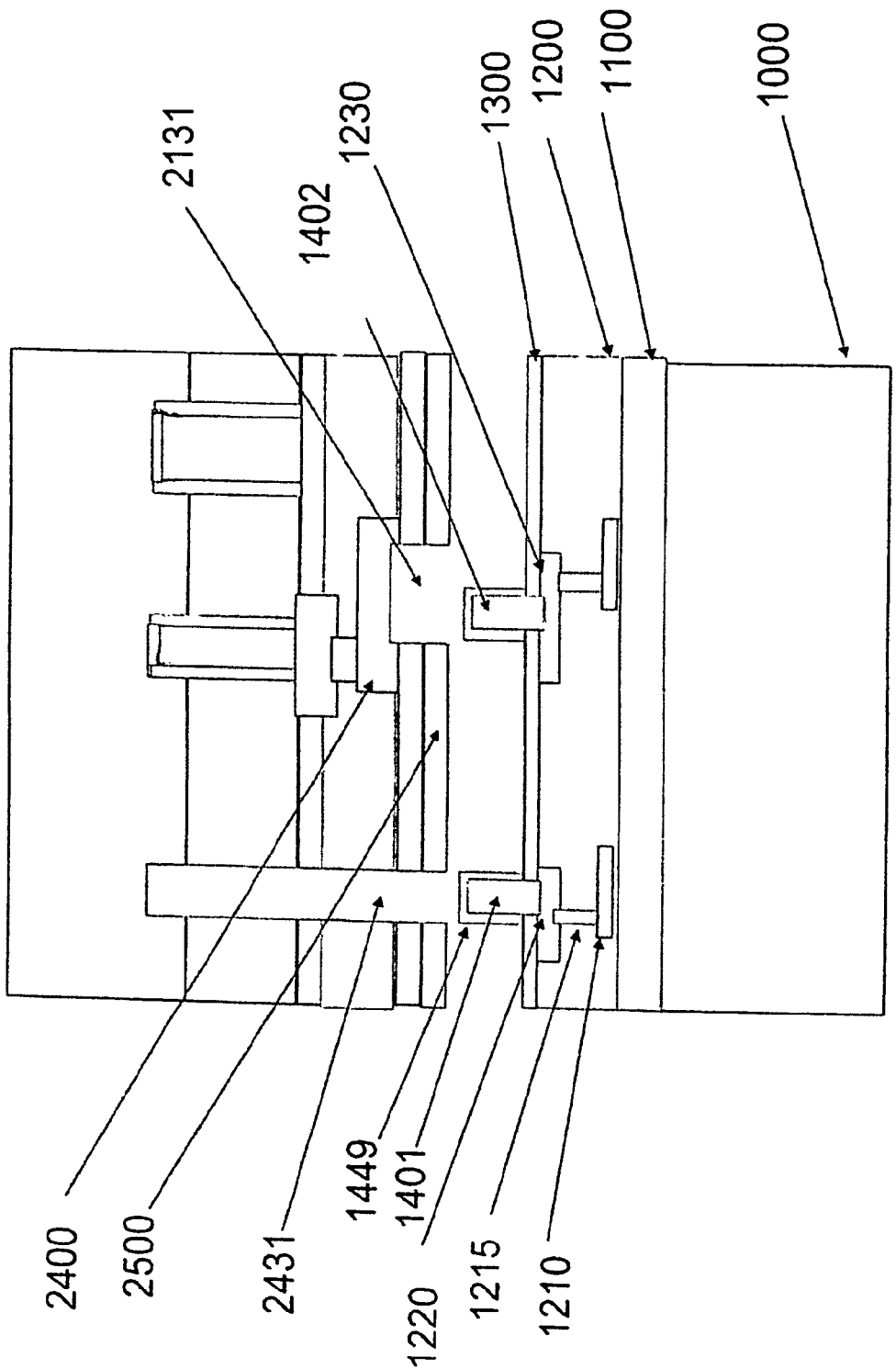
Figure 5:
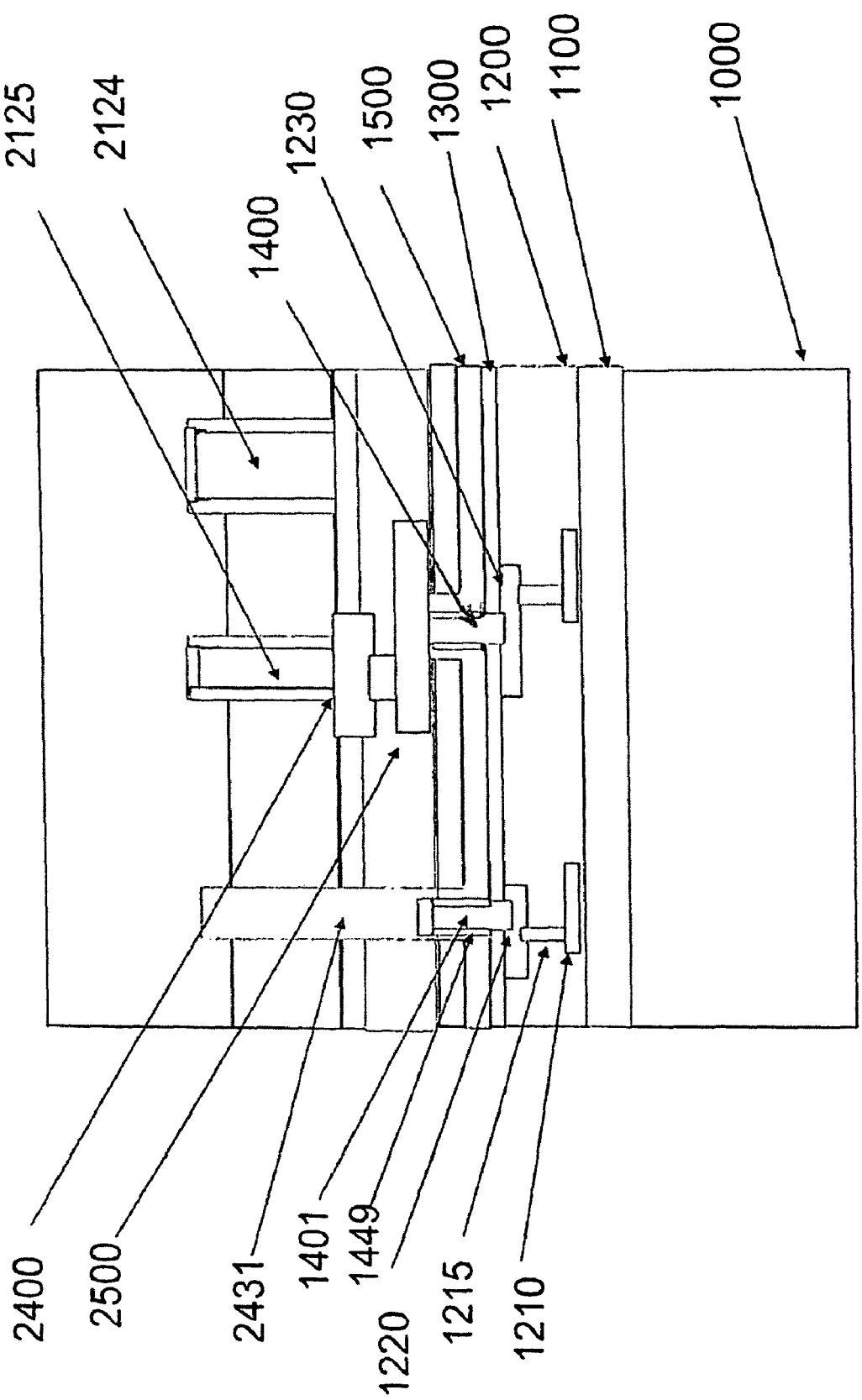
Figure 5:
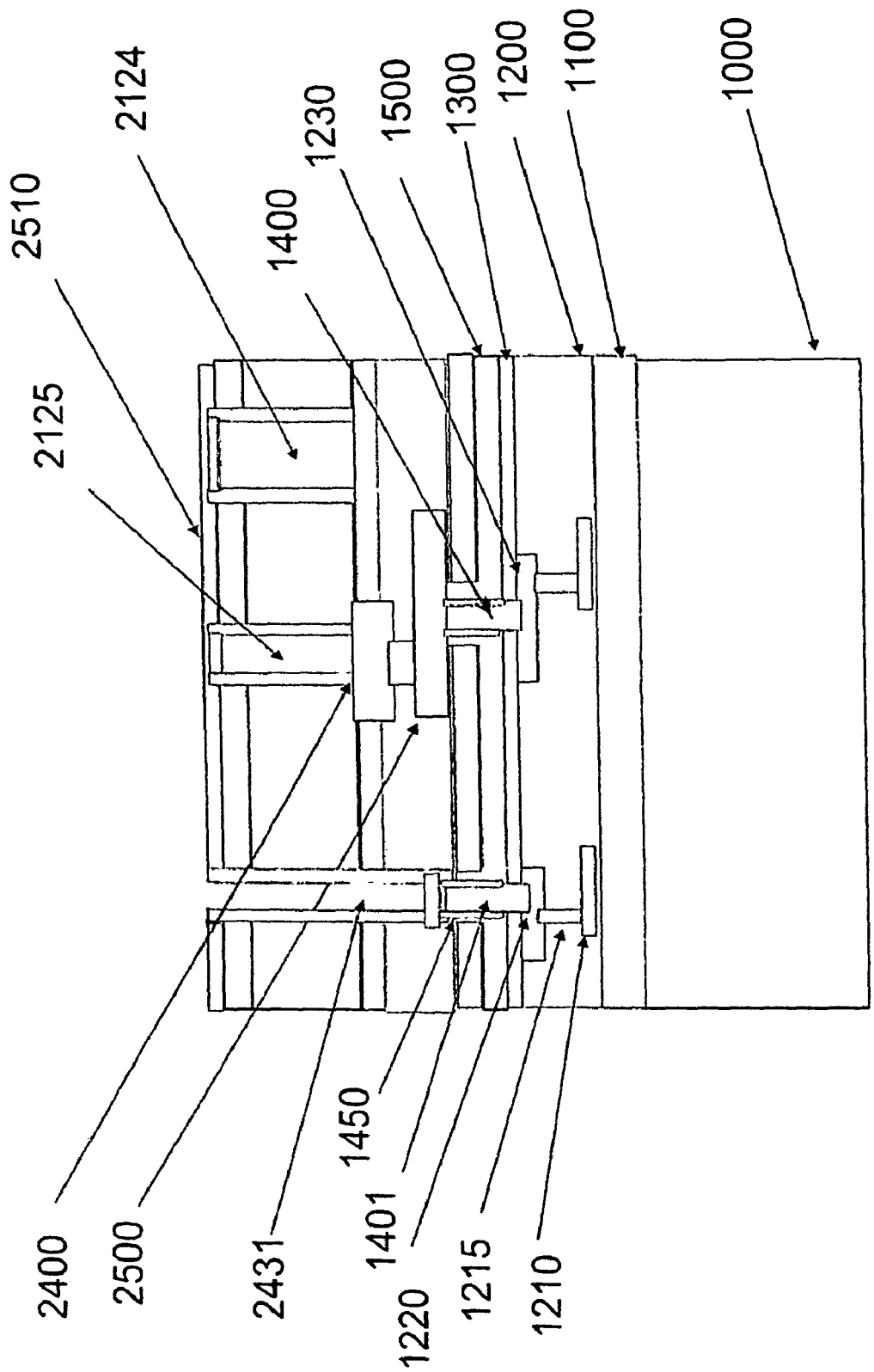
Figure 5:
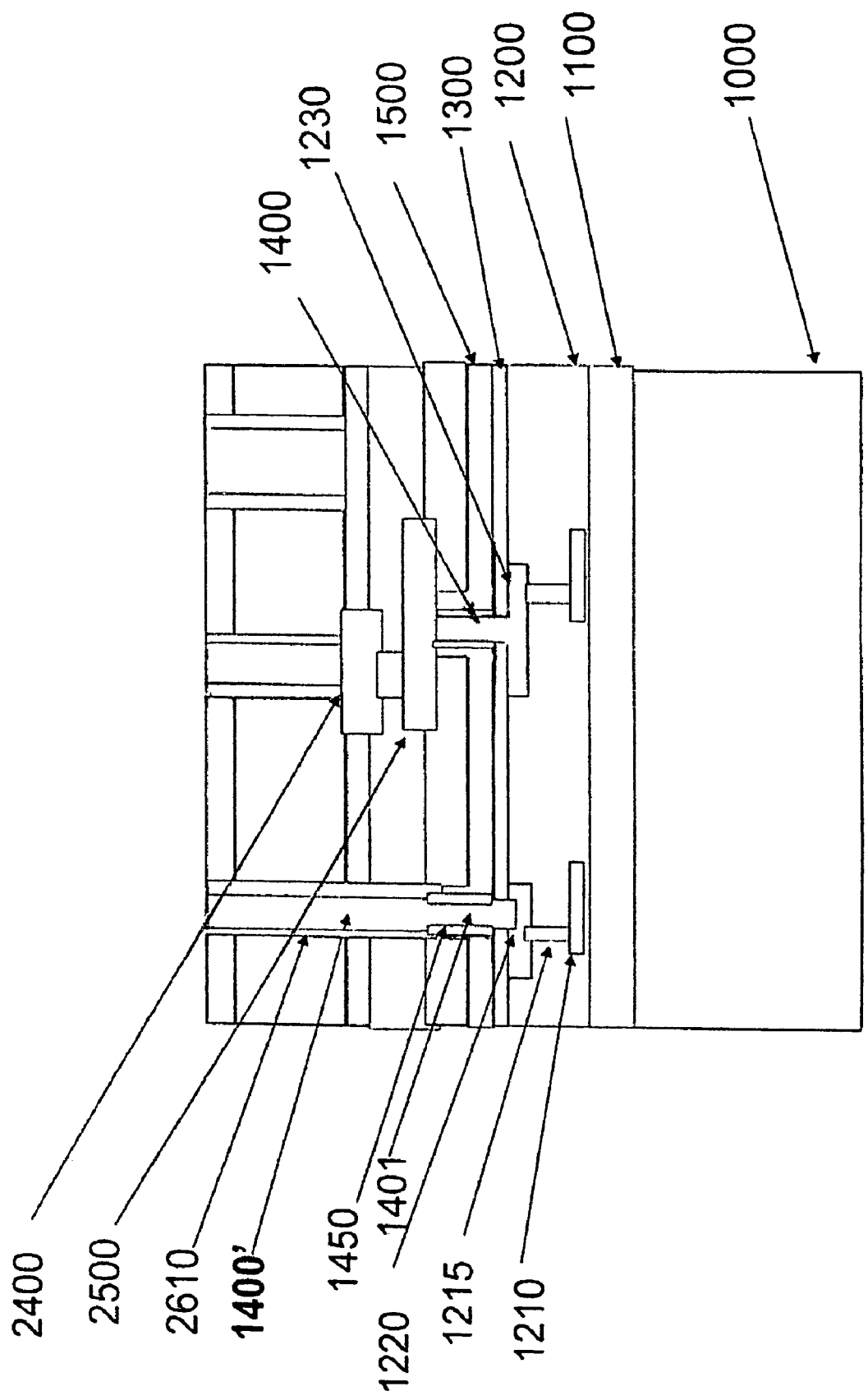
Figure 5:
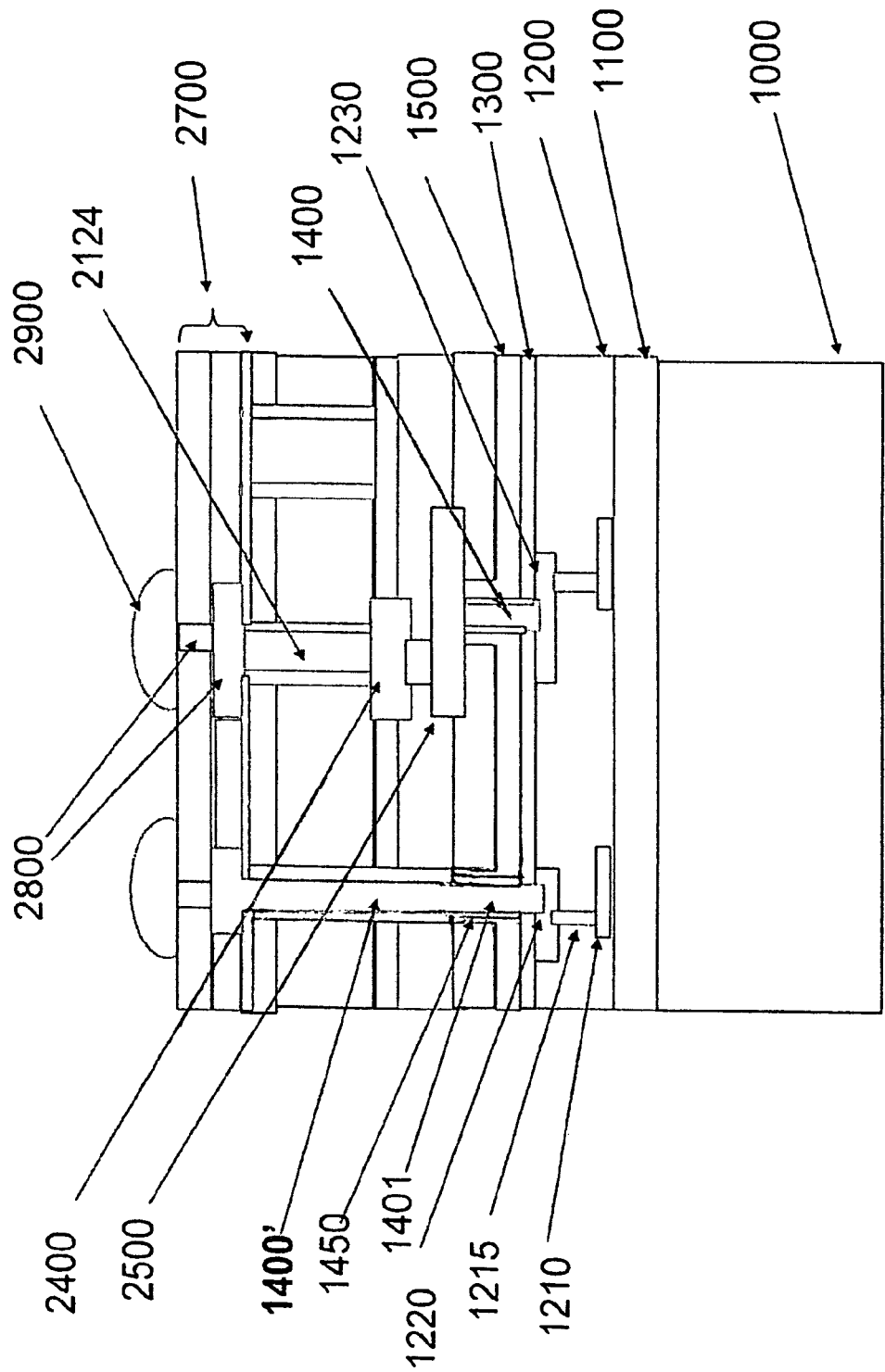

Next the wafer to be thinned (shown in FIG. 5 (A)) is flipped over and aligned to the bottom wafer from FIG. 7(C) so that through vias 2431 are aligned to studs 1401 and vias 2131 are aligned to studs 1402 as shown in FIG. 7(D).

The aligned wafers are brought in intimate contact and laminated together using isostatic pressure resulting in the bonded stud structure 1400. Adhesive 1500 bonds the two wafers together and flows and fills the gaps around the studs 1401 and 1402 as shown in FIG. 7(E).

Next the substrate 2000 is thinned down so that the silicon surface is recessed below the through silicon vias 2124 and 2125 and the through via holes 2431 are exposed. Grinding, polishing, RIE, wet etching or a combination thereof is employed to achieve this result. The resulting structure is shown in FIG. 7(F).

Next a passivation dielectric 2510 is deposited to conformally coat the through vias 2431 and the top surface of the thinned substrate 2000 as shown in FIG. 7(G). Passivation dielectric 2510 is deposited for example by a PECVD process at a temperature compatible with the exposed copper features 1401. Typically process temperatures less than about 400° C. will be used in some embodiments as is commonly known in the art for passivation dielectric coatings used in conjunction with Cu BEOL interconnects.

Figure 7:
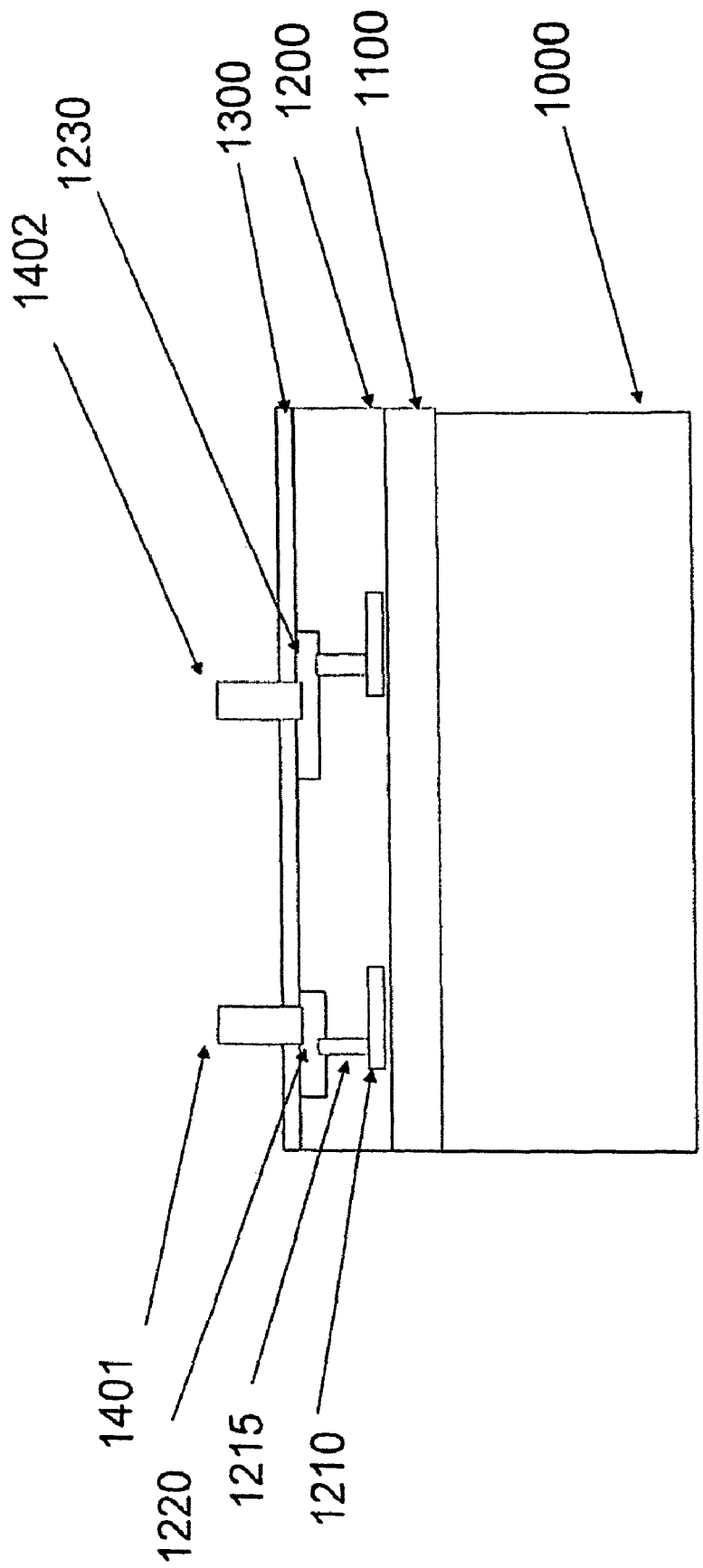
FIGS. 7(A) through 7(I) comprise a schematic process flow for fabricating the inventive device stack structure of the embodiment illustrated in FIG. 6 of the present invention.
Figure 7:
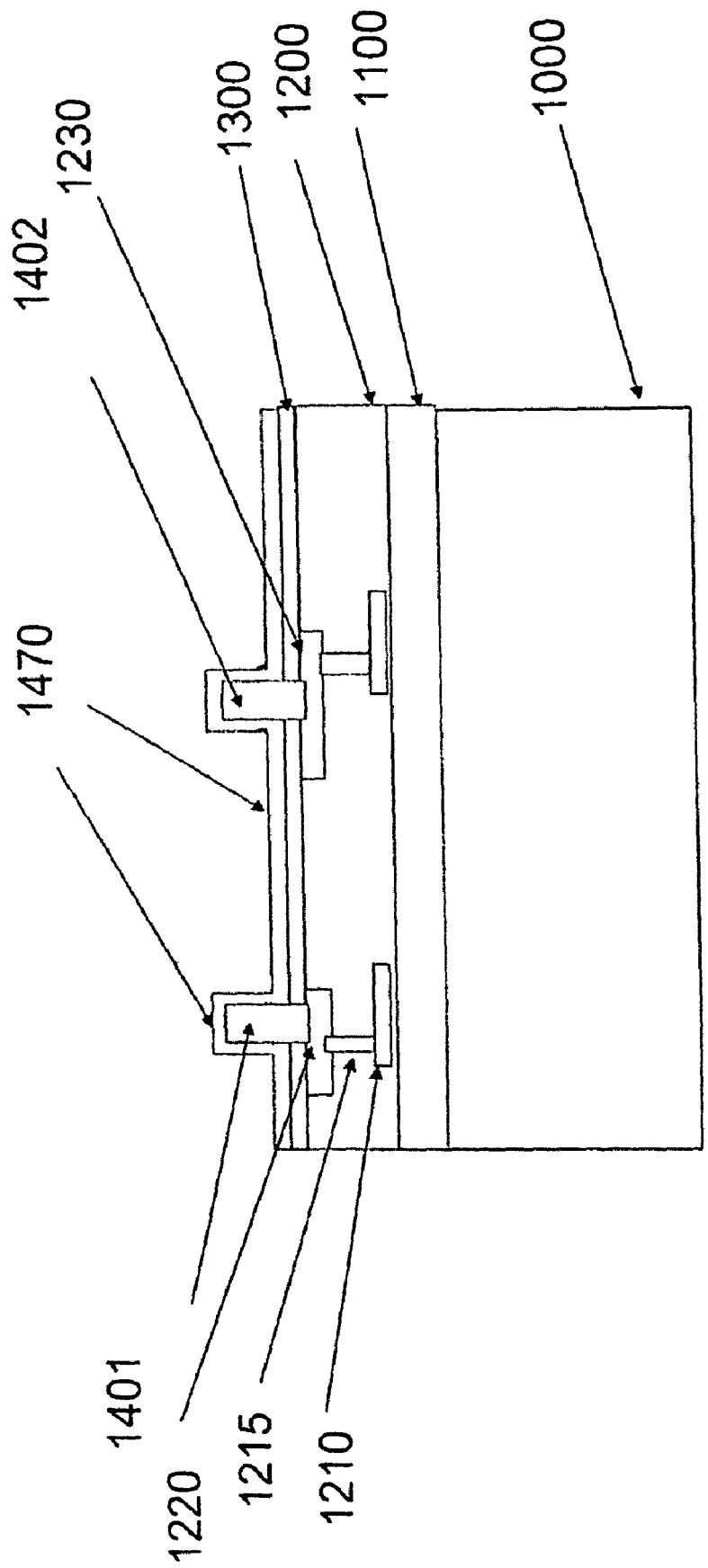
Figure 7:
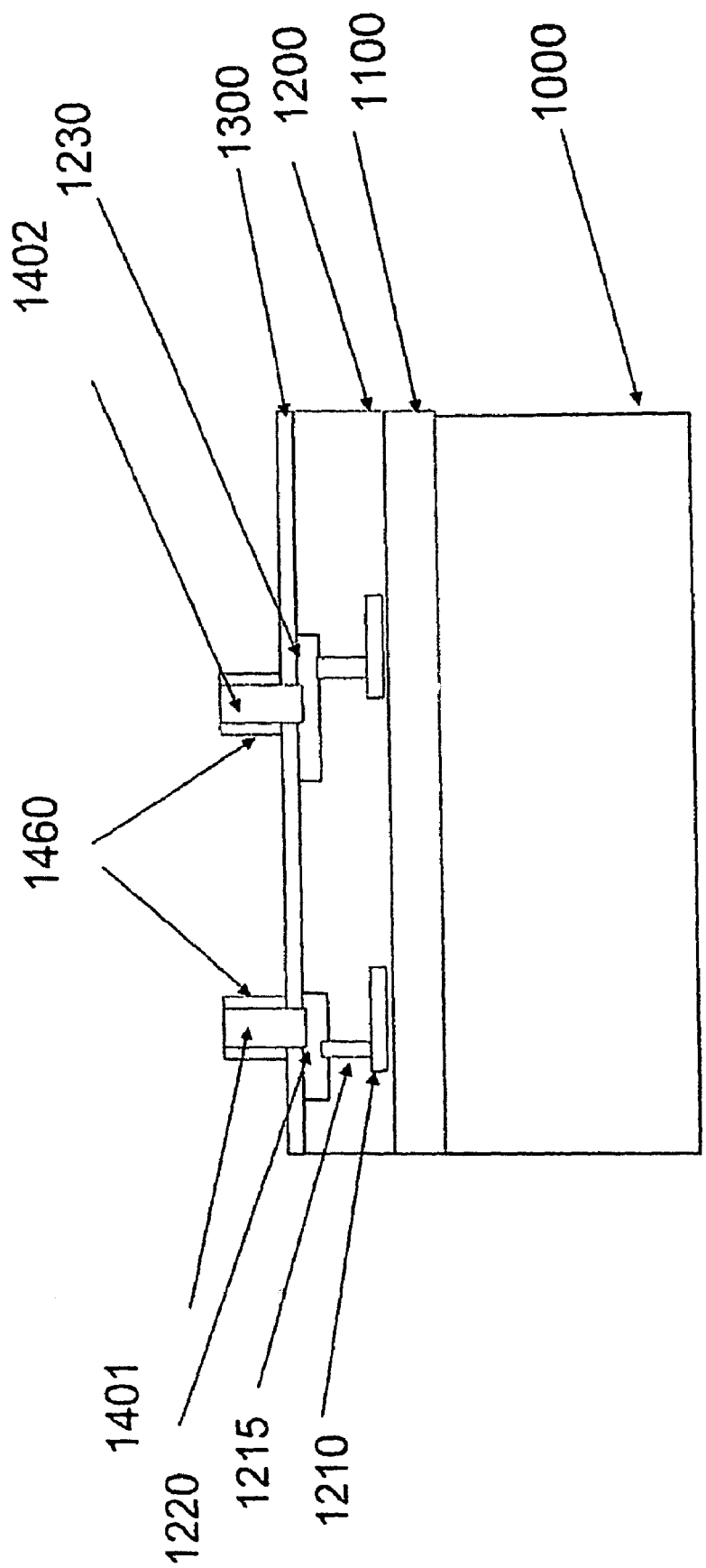
Figure 7:
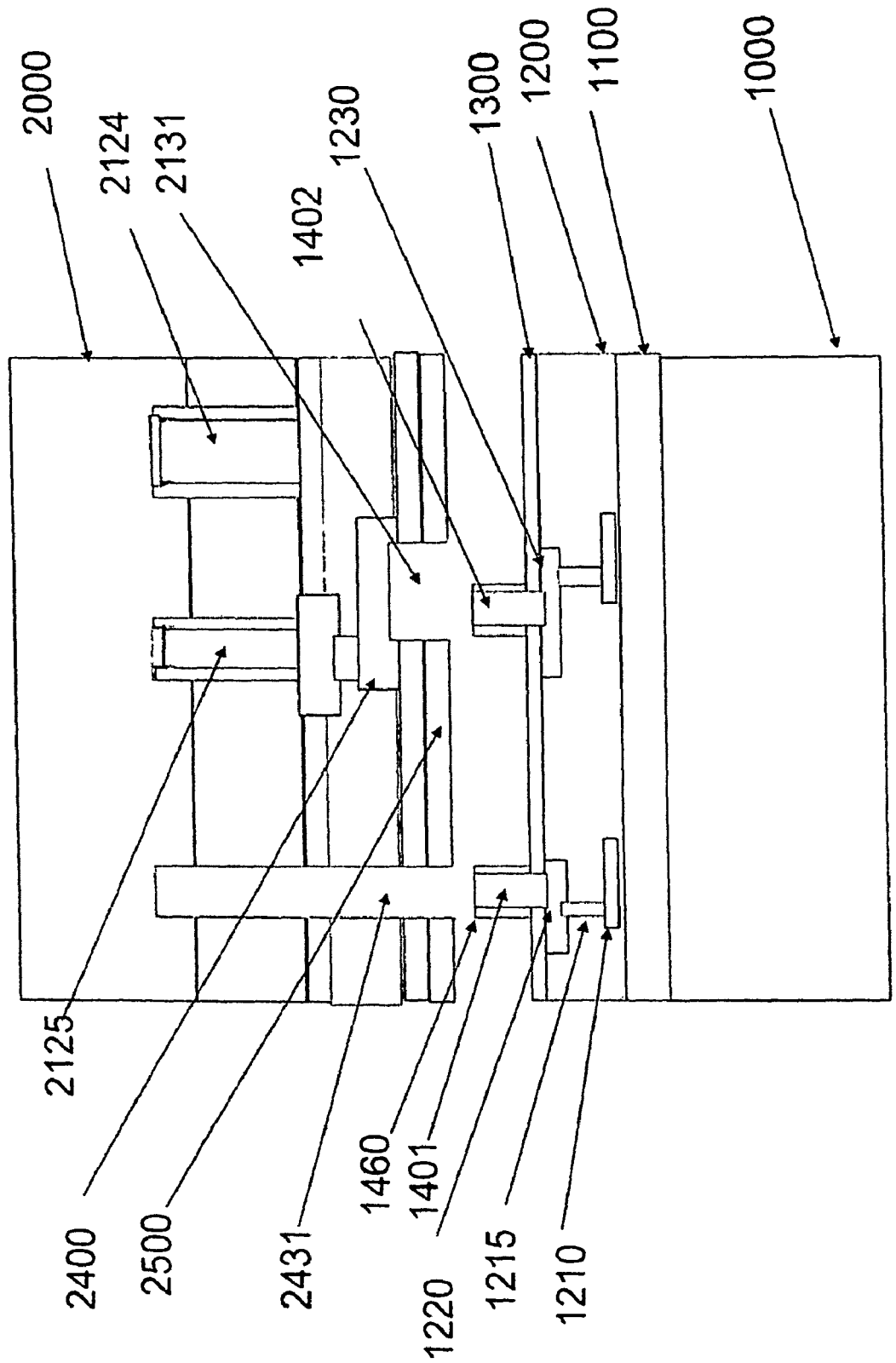
Figure 7:
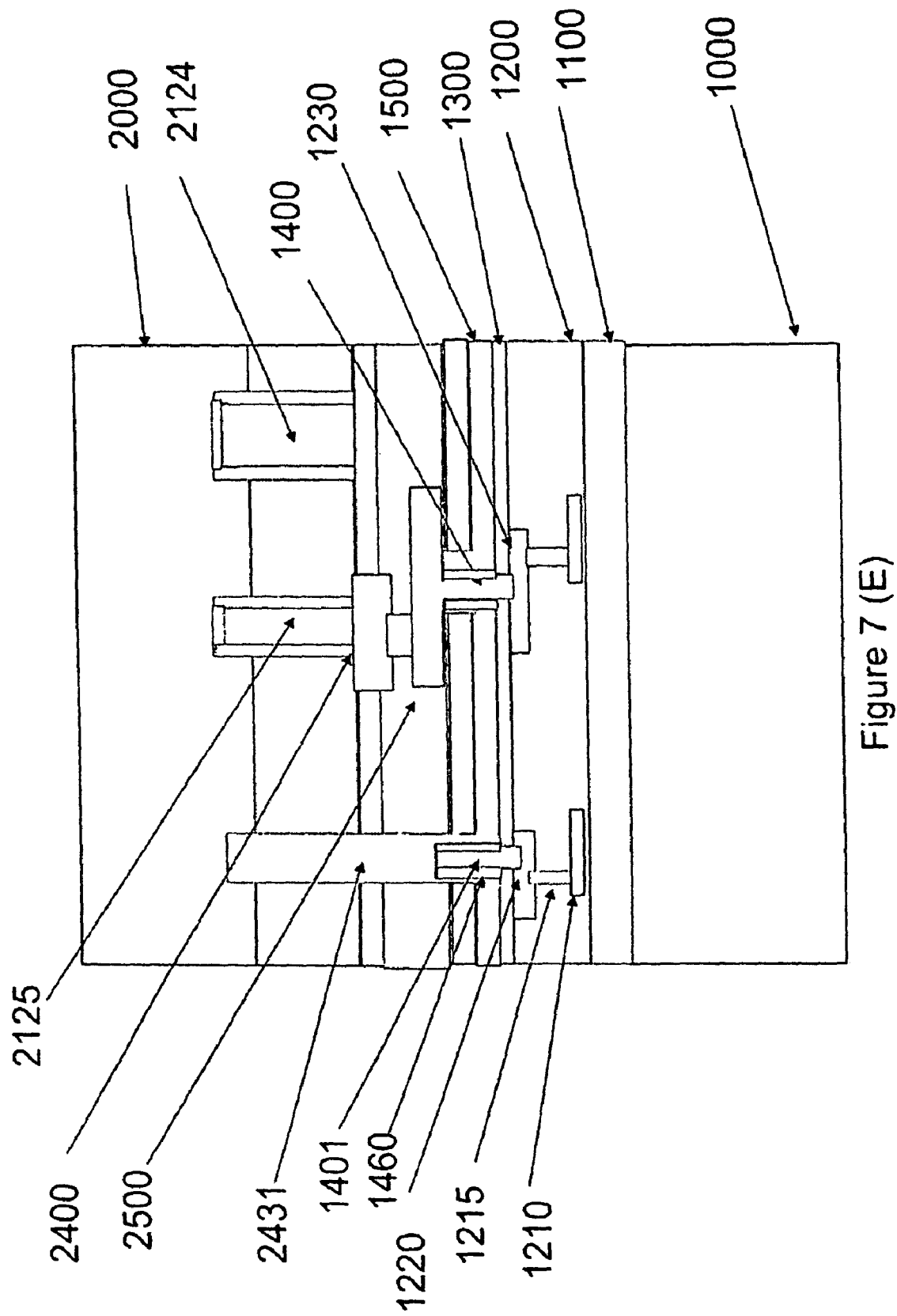
Figure 7:
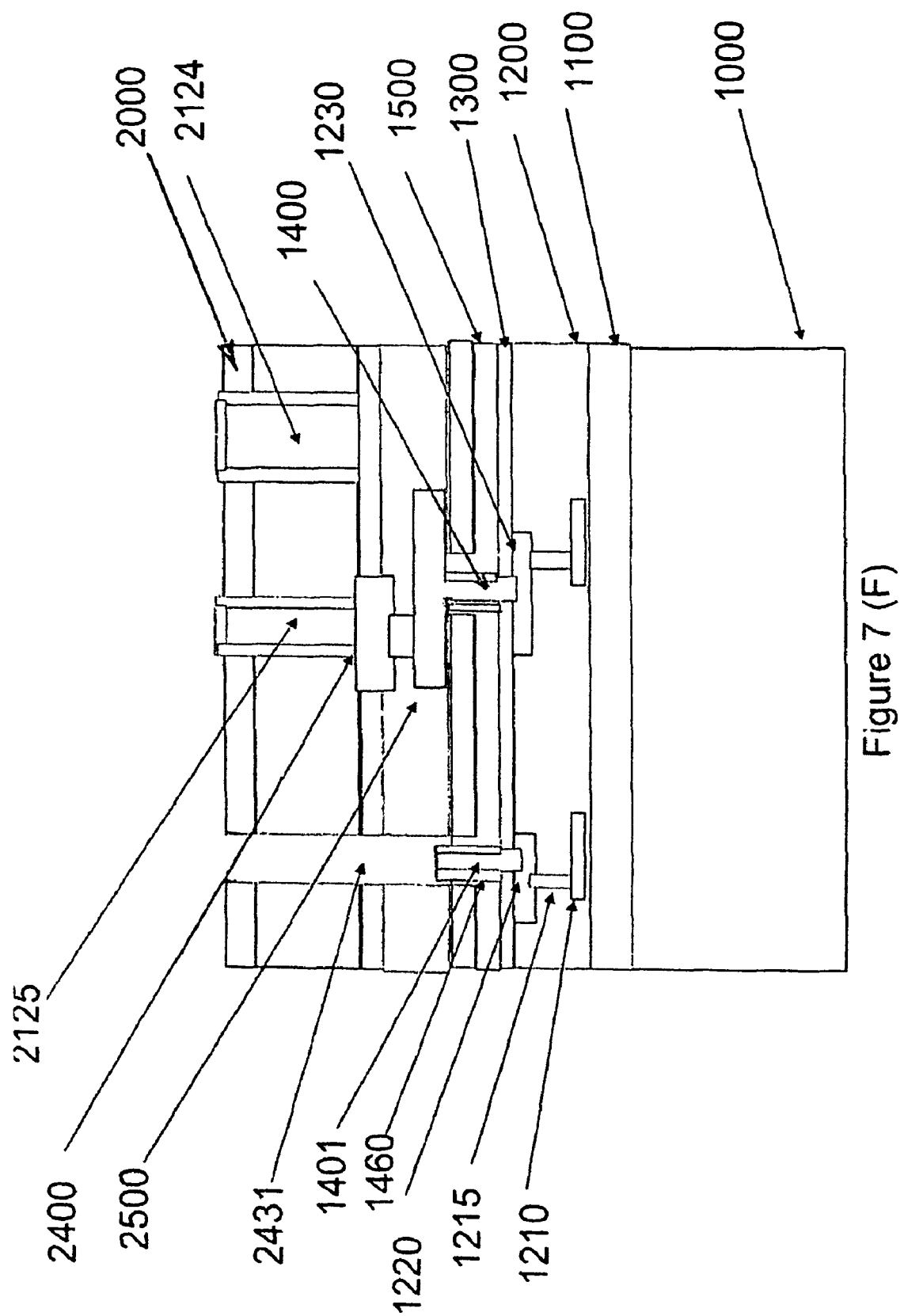
Figure 7:
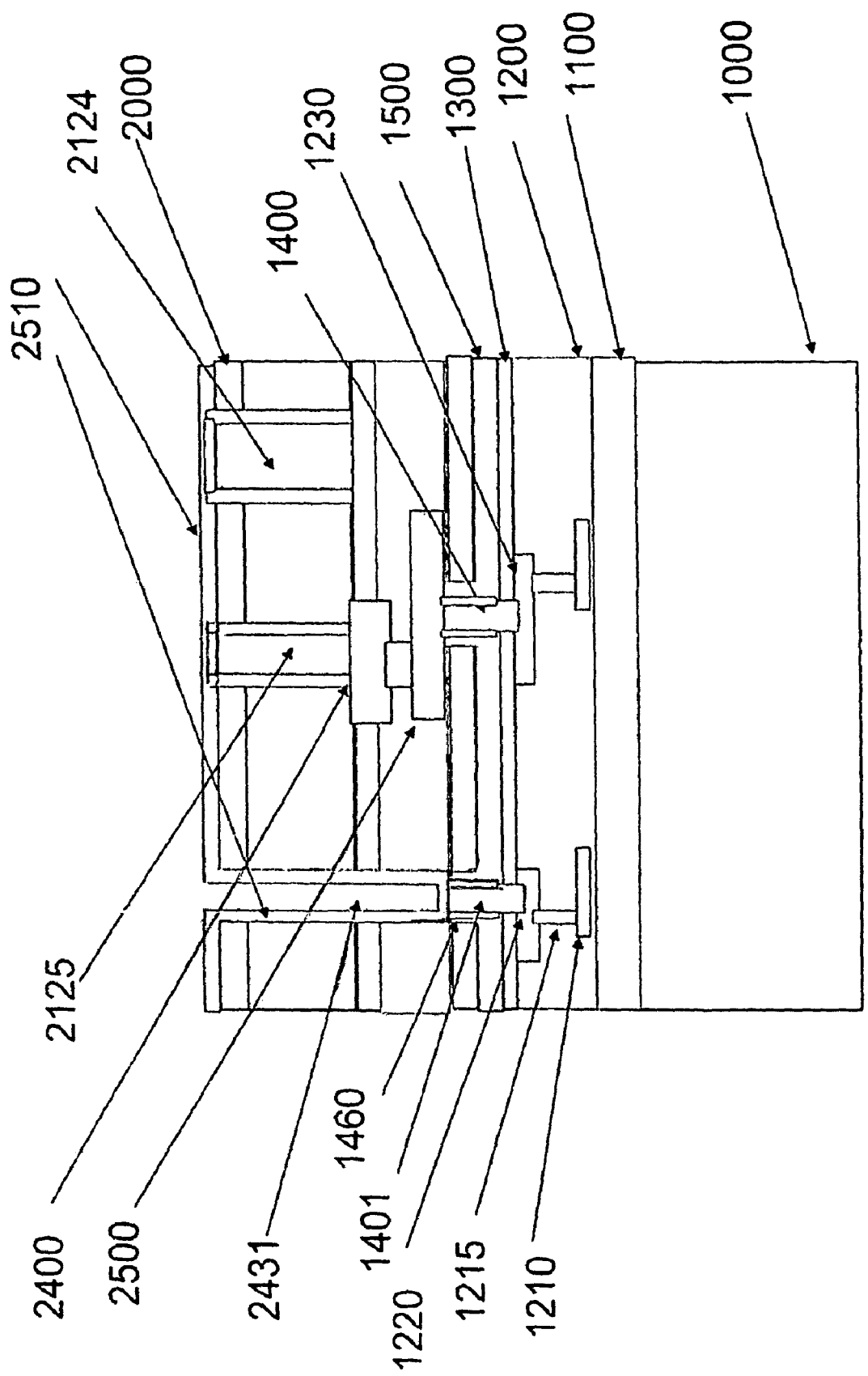
Figure 7:
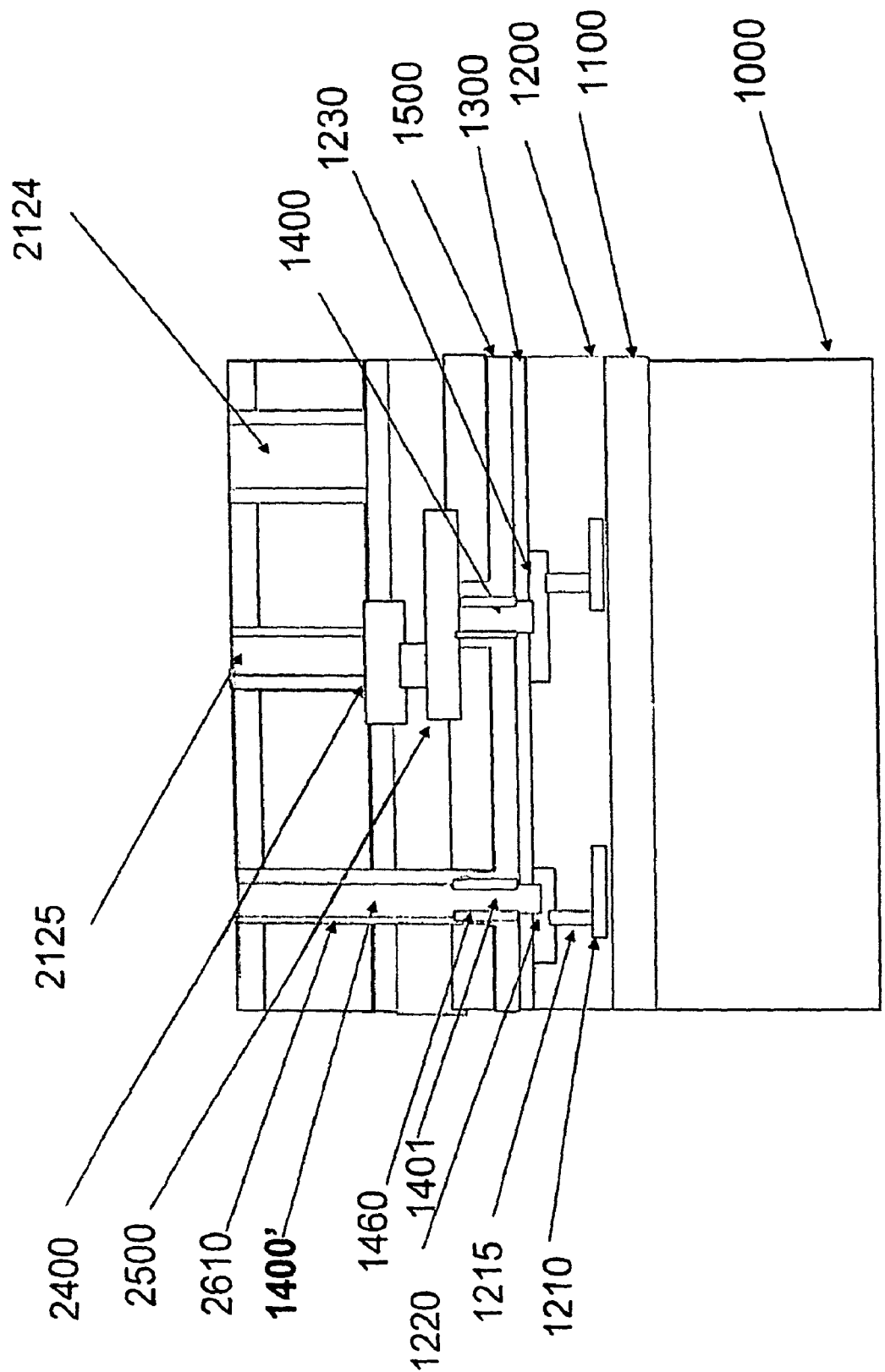
Figure 7:
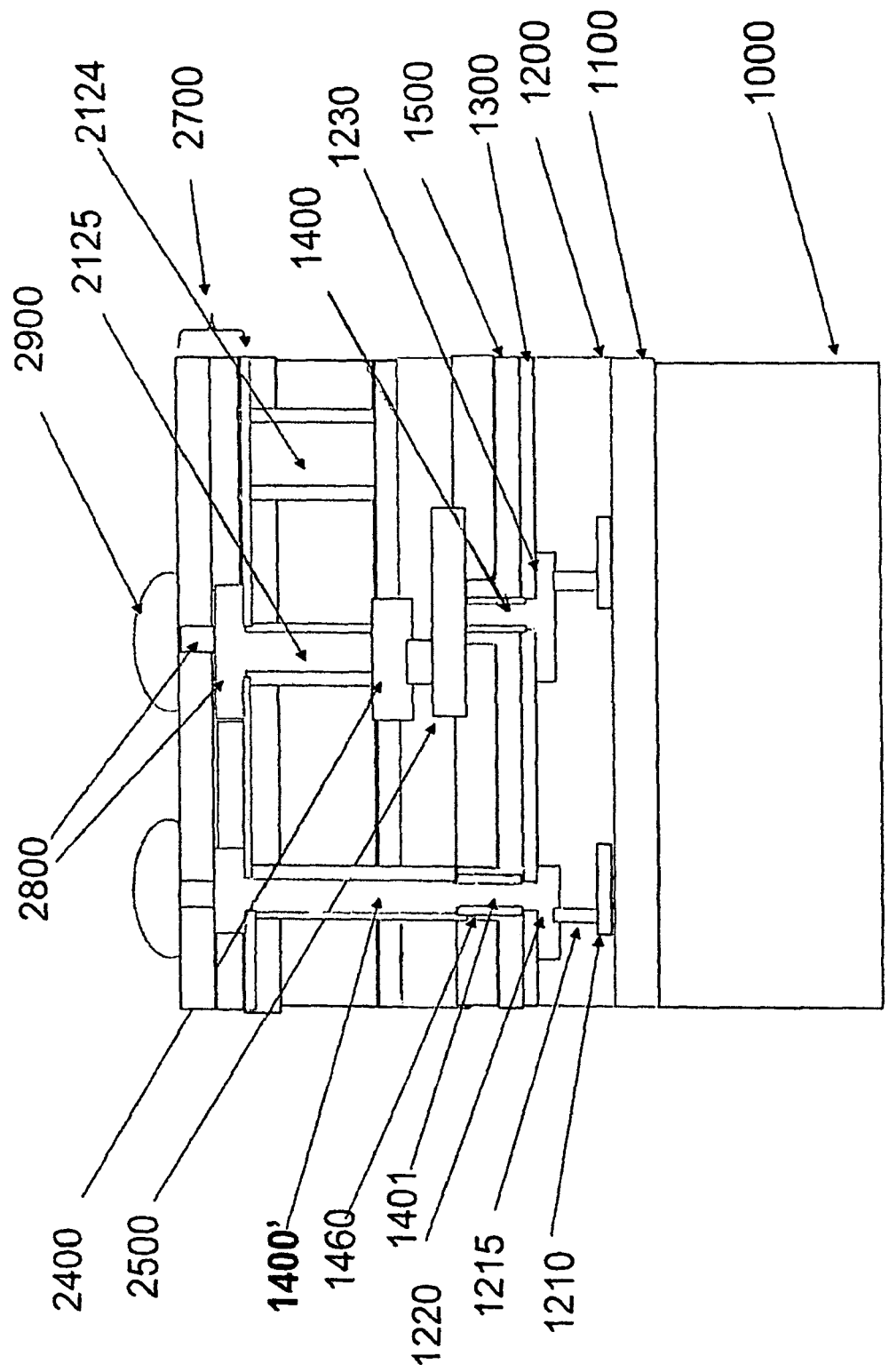

In the next step the passivation dielectric 2510 is removed from everywhere except the sidewalls of through vias 2431 by using a blanket anisotropic etch process, such as RIE or directional ion milling, or equivalent processes capable of removing the same for all horizontal surfaces resulting in sidewall passivation dielectric 2610 to result in the structure shown in FIG. 7 (H). Following this the vias 2431 are filled with a conductive filling of Cu by the known art of damascene processing.

In particular, the filled via may consist of a liner made of refractory metal and refractory metal nitride or combinations thereof with one another, followed by copper produced by a combination of sputter deposition, plating and CMP. The copper filled deep through vias 1400' lined on the sidewalls by the sidewall passivation dielectric 2610 and the filled vias 2124 and 2125 of the thinned substrate 2000 both exposed for further processing at the top surface as seen in this Figure.

Finally, additional BEOL layers shown as ensemble 2700 in FIG. 7(I) can be added by using damascene processes known in the art followed by provision of input output terminals such as solder balls 2900. The BEOL ensemble 2700 may consist of several layers of dual damascene structures 2800 although FIG. 7(I) only shows two exemplary layers for the sake of simplicity. Filled through vias 2124 are shown in FIG. 7(I) as not electrically connected to any pads in the BEOL ensemble unlike filled through vias 2125 which are. Through via features like 2124 are provided for use as fiducial marks to enable lithographic alignment of the BEOL patterns in 2700 so that they are in registration with the patterns in the bonded device stack. Features 2124 can be designed to be of any suitable shape and size to facilitate this alignment process according to the lithographic tooling and masks employed for the fabrication of layers in 2700.

The invention includes additional variations and advantages as follows. With some vias with landing pads and others without landing, the structure can form both blind and through-vias in one step. Furthermore, the passivation of the studs before joining prevents potential corrosion issues commonly associated with bare metal studs such as those made of copper especially under temperature, humidity and electrical field bias conditions. The adhesive used in the structure can also be used for through+blind vias option by applying it on the stud side if the adhesive is coated under the studs' hardmask. This option is useful if the adhesive cannot be used on the via side due to some process limitations. Insulation of the silicon body from through-vias is preferable at device level so that the through-via formation does not expose the Si during the through vias open. Should this not be possible during device stage, a spacer type operation can insulate the Si side walls after the through via etching is completed but before the joining step. It can also be done after the joining and the Si removal. In this post joining case the Cu stud side walls and through vias side walls are covered with a dielectric but studs are selectively exposed for "rivet" connection. The IO pads on the top can be connected to a combination of through and blind vias. The IO can also be connected through the backside of the top-wafer and any added wiring placed thereon. The combination of through and blind and backside wiring can provide joining redundancy to enable correction of any missing connections due to joining yield loss in the blind via/stud connections.

It is inevitable that air pockets might be trapped in the interface during wafer-wafer bonding lamination. Such entrapment normally forms an interface defect that will lead to yield losses. This through via approach described in the present inventive methods provides a means for eliminating or mitigating such defects. This is possible because of the reflowability of the high temperature adhesive and the through via structure. Just a simple re-lamination normally can not eliminate air entrapment defects in the prior art blind via/stud T&J structures since the air pockets have no place to exit the interface. With the top Si removed and the through via exposed in accordance with the present inventive methods, the through via openings structure can now act as vents for trapped air pockets provided a relamination is carried out after the back side thinning of the top wafer which exposes the through via openings. Therefore with a second lamination one can virtually eliminate any lamination defects due to trapped air pockets at the joining interface.

Throughout this specification, abstract of the disclosure, claims, and in the drawings the inventors have set out equivalents, including without limitation, equivalent elements, materials, compounds, compositions, conditions, processes, structures, and even though set out individually, also include combinations of these equivalents such as the two component, three component, or four component combinations, or more as well as combinations of such equivalent elements, materials, compounds, compositions conditions, processes, structures in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, and if not specifically stated herein, the written description, specification, claims, drawings, and abstract of the disclosure as subsequently amended.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A structure comprising two device layers joined together to form an electronic system and further comprising:
 a first device layer disposed on a first substrate and comprising a first set of circuits and interconnect wiring;
 a second device layer disposed on a second substrate and comprising a second set of circuits and interconnect wiring;
 said first and said second device layers further connected using two sets of via connections comprising a first set of via connections that extend from below the top surface of said first device layer to the top surface of said second device layer and a second set of via connections that extend from said top surface of said first device layer through said second device layer, said second substrate and connecting to interconnect layers and input output terminals disposed on the back side of said second substrate;
 said structure further comprising an adhesive layer disposed between said top surface of said first device layer and said top surface of said second device layer and surrounding a portion of the height of said first and said second via connections; and
 further comprising an passivation coating to protect the sidewalls of said first and second sets of vias in said portions where they are surrounded by said adhesive layer.

2. A structure according to claim 1 further comprising at least one more device layer in the manner of said second device layer, stacked on and attached to the back side of said second device layer and connected to said first and said second device layers and said input output terminal by means of additional via connections.

3. A structure according to claim 1 wherein said circuits in said first and second device layer comprise any one of logic circuits, memory circuits, controller circuits, image processing circuits, optoelectronic circuits and combinations thereof.

4. A structure according to claim 1 wherein said interconnect layers in said second device layer comprise dual damascene wiring and vias, through substrate vias and combinations thereof.

5. A structure according to claim 1 wherein said first and second substrates comprise silicon, or gallium arsenide, or silicon carbide.

6. A structure according to claim 1 wherein said adhesive layer comprises a polyimide adhesive, or benzocyclobutene adhesive, or polyarylene ether adhesive, or epoxy adhesive.

7. A structure according to claim 1 wherein said through vias comprise electrically conductive Al, Mo, W, Cu, Au, Ag, Pd, Pt, Ni, or combinations thereof.

* * * * *